(12) United States Patent
Ida et al.

(10) Patent No.: US 7,119,004 B2
(45) Date of Patent: Oct. 10, 2006

(54) SEMICONDUCTOR DEVICE, ITS MANUFACTURING METHOD, AND RATIO COMMUNICATION DEVICE

(75) Inventors: Tsutomu Ida, Komoro (JP); Yoshihiko Kobayashi, Tateshina (JP); Masakazu Hashizume, Tateshina (JP); Yoshinori Shiokawa, Komoro (JP); Sakae Kikuchi, Yachiho (JP)

(73) Assignees: Renesas Technology Corp., Tokyo (JP); Renesas Eastern Japan semiconductor, Inc., Tokyo (JP)

( * ) Notice: Subject to any disclaimer, the term of this patent is extended or adjusted under 35 U.S.C. 154(b) by 208 days.

(21) Appl. No.: 10/486,707

(22) PCT Filed: May 28, 2002

(86) PCT No.: PCT/JP02/05154

§ 371 (c)(1),
(2), (4) Date: Feb. 13, 2004

(87) PCT Pub. No.: WO03/023843

PCT Pub. Date: Mar. 20, 2003

(65) Prior Publication Data

US 2004/0245655 A1 Dec. 9, 2004

(30) Foreign Application Priority Data

Sep. 5, 2001 (JP) .............................. 2001-269160

(51) Int. Cl.
*H01L 21/44* (2006.01)
(52) U.S. Cl. ....................... 438/617; 438/612
(58) Field of Classification Search ................ 438/617, 438/612
See application file for complete search history.

(56) References Cited

U.S. PATENT DOCUMENTS 6,172,567 B1    1/2001   Ueno et al.
6,489,680 B1 *  12/2002  Kohjiro et al. ............. 257/728

FOREIGN PATENT DOCUMENTS

| EP | 971 411  | 1/2000  |
|----|----------|---------|
| JP | 1-162236 | 11/1989 |
| JP | 4-221837 | 8/1992  |
| JP | 5-013474 | 1/1993  |
| JP | 5-114800 | 5/1993  |
| JP | 9-148623 | 6/1997  |
| JP | 9-283700 | 10/1997 |
| JP | 10-50737 | 2/1998  |
| JP | 10-070159| 3/1998  |
| JP | 63-99555 | 4/1998  |

(Continued)

*Primary Examiner*—Roy Potter
(74) *Attorney, Agent, or Firm*—Mattingly, Stanger, Malur & Brundidge, P.C.

(57) ABSTRACT

The variation of the parasitic inductance generated at the output terminal of a transistor in the final stage of a multi-stage amplifier unit is reduced. One side of the semiconductor chip that includes the final stage transistor is put in contact with the inner wall of a square recess formed in a wiring substrate. The semiconductor chip is positioned and fixed accurately at the bottom of the recess, whereby the drain wire of the transistor is fixed. Then, a chip edge at which the drain electrode is disposed on top of the chip is put in contact with the inner wall of the recess, which is closer to the drain bonding pad. A metallized layer is formed of the same size as that of the chip at the bottom of the recess and a fusion bonding material is supplied on the metallized layer.

22 Claims, 17 Drawing Sheets

FOREIGN PATENT DOCUMENTS

| | | |
|---|---|---|
| JP | 2000-21926 | 1/2000 |
| JP | 2001-7657 | 1/2000 |
| JP | 2000-151310 | 5/2000 |
| JP | 2001-237648 | 8/2001 |
| WO | WO00/03490 | 1/2000 |

* cited by examiner

FIG. 24
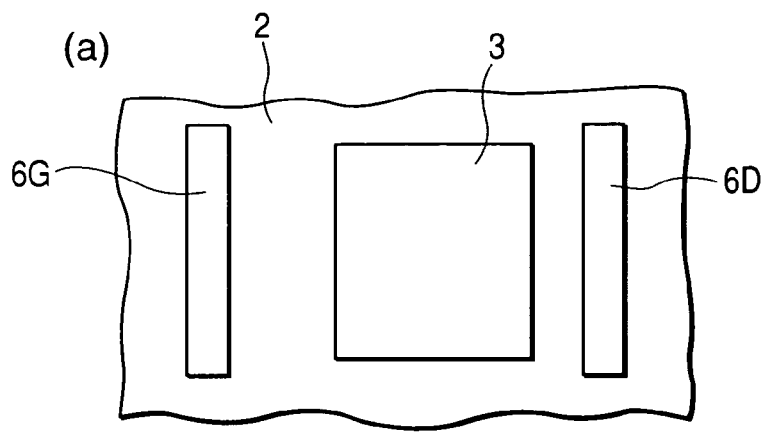
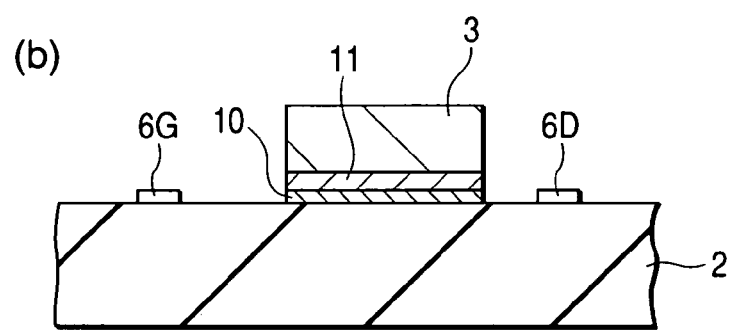
FIG. 25
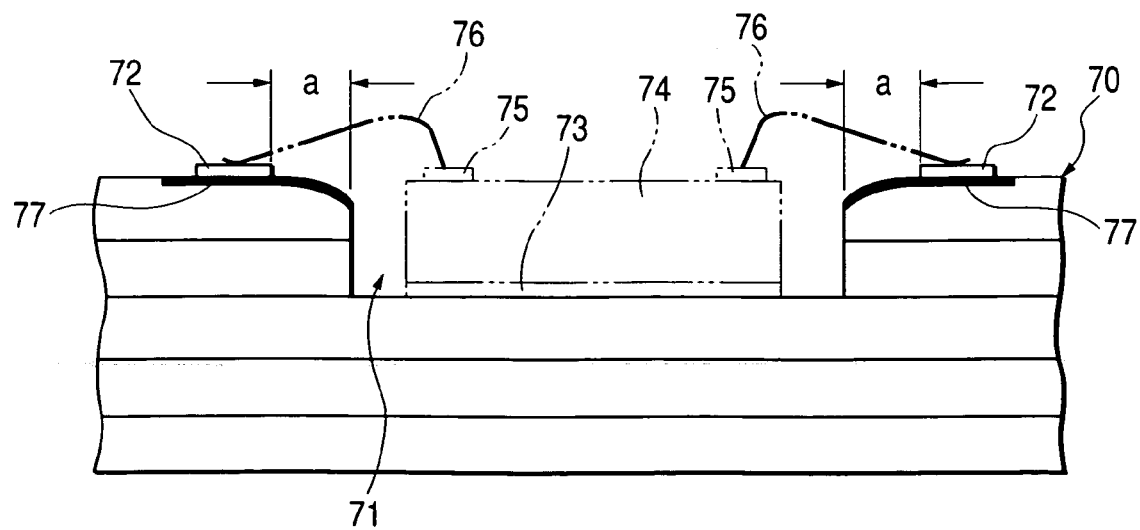

SEMICONDUCTOR DEVICE, ITS MANUFACTURING METHOD, AND RATIO COMMUNICATION DEVICE

TECHNICAL FIELD

The present invention relates to a semiconductor device, its manufacturing method, and a radio communication device, more particularly to a technique applicable effectively to a multistage amplifier unit (high frequency power amplification unit: high frequency power amplification module) configured by a plurality of semiconductor amplification elements connected serially in a plurality of stages and such a radio communication device as a mobile phone in which the high frequency power amplification unit is built.

BACKGROUND ART

A high frequency power amplification unit employed for such a radio communication device as a car telephone, mobile phone, or the like is configured by a plurality of amplifiers, each being configured by a transistor (semiconductor amplification element) and connected to another serially. Usually, two or three of such amplifiers are disposed in a plurality of amplification stages. The amplifier in the last stage (final amplification stage) is defined as an output one and each amplifier (amplification stage) positioned before the final amplification stage is defined as a driving stage. An inductor used to adjust the circuit impedance is built in each of those amplification stages.

This type of high frequency power amplification is already disclosed in the official gazettes of Japanese Unexamined Patent Publication No. Hei 9(1997)-283700 and Japanese Unexamined Patent Publication No. Hei 10(1998)-70159. In the high frequency power amplifier disclosed in the official gazette of Japanese Unexamined Patent Publication No. Hei 9(1997)-283700, a power transistor (semiconductor chip: bare chip) is fixed at the bottom of each aperture provided in the top face of a multi-layer substrate formed mainly of glass. A gap is formed between the periphery of the power transistor and the inner wall surface of the aperture. Consequently, the fixing position of the power transistor (semiconductor chip) is never restricted by the inner wall of the aperture.

The official gazette of Japanese Unexamined Patent Publication No. Hei 10(1998)-70159 describes a technique for manufacturing a high frequency module in which a semiconductor chip is provided at the bottom of each aperture provided in the main surface of a printed circuit board. Also in this example, the semiconductor chip never comes in contact with the inner wall of the aperture, so that its fixing position is not restricted by the inner wall of the aperture.

On the other hand, the official gazettes of Japanese Unexamined Patent Publication No. Hei 5(1993)-13474 and Japanese Unexamined Patent Publication No. Hei 9(1997)-148623 disclose techniques for fixing a semiconductor chip in a predetermined position respectively.

According to the technique disclosed by the official gazette of Japanese Unexamined Patent Publication No. Hei 5(1993)-13474, an area on a die pad is plated in a similar shape to that of a die to be mounted on the die pad or a size smaller than the die, then the die is placed on the plated die pad together with a wax material, and finally adhered with the wax material there accurately.

The official gazette of Japanese Unexamined Patent Publication No. Hei 9(1997)-148623 discloses a technique for fixing a light receiving/emitting element on the target substrate. According to the technique, a laminated metallic layer of the same in size as the light receiving/emitting element is provided on the target substrate beforehand, then the element is heated to improve the accuracy of the height between the reference plane and the light axis of the light receiving/emitting element, thereby the light receiving/emitting element is fixed accurately there.

The official gazette of Japanese Unexamined Patent Publication No. Hei 5(1993)-114800 also discloses a technique for fixing a semiconductor chip accurately in a rectangular recess formed in the target substrate. According to the technique, fine vibrations are applied to the recess by supersonic waves to position and fix the semiconductor chip accurately. However, this technique just positions and fixes the semiconductor chip in the recess by inclining the inner wall of the recess and using the inclined plane to move the chip or using a surface tension of a member having the predetermined surface tension, which is inserted between the chip and the side face (inner wall) of the recess. It does not restrict the fixing position of the semiconductor chip directly by the inner wall of the recess.

As described above, the high frequency power amplification unit is used as an amplifier of the subject mobile phone. A high frequency power amplification unit (high frequency power amplification module) built in a mobile phone usually employs a multistage structure in which two or three transistors (semiconductor amplification elements) are connected serially to form a multistage amplifier unit. The electrode of each transistor is connected to such a wiring line as a micro-strip line of the module substrate through a conductive wire.

Generally, a chip bonding device is used to supply semiconductor chips to be fixed in the manufacturing process of the high frequency power amplification module. The accuracy of positioning and fixing those chips is decided by the performance accuracy of the chip bonding device or the solder reflowing after the chip is supplied.

In any way, the accuracy of positioning and fixing semiconductor chips comes to be affected by the supplying accuracy of those chips by a chip bonding device or the like.

If the fixing position of a semiconductor chip is varied, the length of the wire for connecting the electrode provided on the surface of the semiconductor chip to a wire electrically in the subsequent process comes to be varied.

Conventionally, consideration has been taken only to the accuracy in chip bonding of each transistor (semiconductor chip) of the high frequency power amplification module in its predetermined position. And, it has been considered that if a semiconductor chip is fixed accurately, the wire length also comes to be determined as it is designed.

In such a radio communication device as a mobile phone that is required of high and efficient outputs, however, such conventional techniques have been found imperfect, since the techniques depend only on the performance of such a chip bonding device. In other words, it is found that in a high frequency power amplification module that employs a multistage amplifier unit, if the connection length between the output terminal of the transistor in the final amplification stage (for example, drain electrode of an FET and collector electrode of a bipolar transistor) and a wiring is varied, the parasitic inductance comes to be varied and both output and efficiency of the device come to be varied.

To avoid such a problem, therefore, it is desirable that the length of the wire for connecting the output terminal of the transistor in the final stage to a wiring should be shorter to reduce the parasitic inductance.

FIG. 25 shows a typical cross sectional view of a wire bonding portion according to a conventional technique, which includes a problem that must be solved. As shown in FIG. 25, in a ceramic wiring board 70 manufactured by a lamination method, the periphery of a recess 71 formed in a main surface (top face) of the board 70 is shaped as an inclined or arc plane due to the sags that occur at the manufacturing time, thereby the surface of each bonding pad used to connect a wire also comes to be shaped as an inclined or arc plane. As a result, the connection property of the wire bonding is often degraded.

In other words, the ceramic wiring board 70 is formed as follows; at first, a plurality of patterned green sheets that include a printed conductor layer are laid in layers and pressed into a laminated substrate, then the laminated substrate is heated and baked to obtain a baked ceramic plate to be used as the board 70. In this baking process, the periphery of the recess 71 is melted and flown into the recess. This is why the periphery of the recess 71 comes to sag.

If a bonding pad for wire bonding is formed at a halfway to the periphery of the recess 71, therefore, the top face of the bonding pad is not flattened, but inclined or arced, resulting in imperfect wire bonding.

To avoid such problems, the inventors of the present invention propose a technique for disposing a bonding pad 72 outside a position apart from the periphery of the recess 71 by a predetermined distance "a". This bonding pad 72 is connected to one end of the wire 76 having the other end connected to the electrode 75 of the semiconductor element (semiconductor chip) 74 fixed at the bottom of the recess 71 with a bonding material (fusion boding material) 73 therebetween. The bonding pad 72 is also connected to the wiring 77.

In such a structure, however, the wire 76 for connecting the electrode 75 of the semiconductor element (semiconductor chip) 74 to the bonding pad 72 comes to be longer, thereby the parasitic inductance increases.

Under such circumstances, it is an object of the present invention to accurately position and fix a semiconductor element in an amplification stage of a semiconductor device in which a multistage amplifier unit is built.

It is another object of the present invention to provide a technique for forming a wire that connects an electrode of a semiconductor element to a bonding pad of a wiring accurately at a predetermined length in a semiconductor device in which a multistage amplifier unit is built.

It is still another object of the present invention to provide a technique for fixing the length of a wire that connects an electrode of a semiconductor element to a bonding pad of a wiring accurately at a predetermined length and fixing the parasitic inductance in a semiconductor device in which a multistage amplifier unit is built, thereby stabilizing the production yield of semiconductor devices.

It is still another object of the present invention to reduce the variation of the parasitic inductance at the output terminal side of the transistor in the final stage of a semiconductor device in which a multistage amplifier is built.

It is still another object of the present invention to improve the output of a semiconductor device (high frequency power amplification unit) in which a multistage amplifier unit is built and improve the output of a radio communication device in which the high frequency power amplification unit is built.

These and other objects, novel features of the present invention will become more apparent upon reading of the following detailed description and accompanying drawings.

DISCLOSURE OF THE INVENTION

Typical some of the features of the present invention to be disclosed in this specification will be summarized as follows.

(1) One of the features of the present invention is a semiconductor device comprising: a wiring substrate (module substrate); a plurality of semiconductor chips, each of which includes a field effect transistor (FET) and is fixed on a metallized layer formed on a main surface of the wiring substrate with a heat-fusion bonding material; and a conductive wire for connecting both gate and drain electrodes of the semiconductor chip to bonding pads provided on the main surface of the wiring substrate, so that each of the plurality of field-effect transistors is connected to another serially in order to form each amplification stage of the multistage amplifier unit. At least one of the transistors is defined as the final amplification stage transistor and structured so that the drain wire for connecting the drain electrode to a bonding pad is shorter than the gate wire for connecting the gate electrode to a bonding pad.

In each semiconductor chip, the distance between the drain electrode and the edge of the chip in the direction in which the drain wire is extended is shorter than the distance between the gate electrode and the edge of the chip in the direction in which the gate wire is extended.

Each semiconductor chip positioned between a gate bonding pad corresponding to the gate electrode and a drain bonding pad corresponding to the drain electrode is fixed at the wiring substrate so as to be one-sided closer to the drain bonding pad.

Recesses are provided in the main surface of the wiring substrate and a semiconductor chip is fixed on a metallized layer formed at the bottom of each recess with a heat-fusion bonding material therebetween. One side of each semiconductor chip on which drain electrodes are disposed comes in contact with the inner wall of the recess to position the chip. The metallized layer is extended up to the inner wall of the recess, which is one-sided closer to the drain bonding pad. The metallized layer and the semiconductor chip thus become the same in size, as well as the heat-fusion bonding material for adhering the chip to the metallized layer is the same in size as the semiconductor chip. The position of the semiconductor chip fixed on the metallized layer is adjusted due to the self-alignment action of the fused bonding material.

In each semiconductor chip, a plurality of (for example, two) multistage amplifier units are formed so as to correspond to two communication systems. The input and output terminals of each of the two multistage amplifier units are independent of those of the other amplifier unit.

Such semiconductor devices are manufactured by the following manufacturing method. Concretely, the method applies to semiconductor devices, each comprising: a wiring substrate (module substrate); a plurality of semiconductor chips, each of which includes a transistor and is fixed on a metallized layer formed on the main surface of the wiring substrate with a fusion bonding material therebetween; and a conductive wire for connecting both control and signal output electrodes of the semiconductor chip to bonding pads provided on the main surface of the wiring substrate electrically. Each of the plurality of transistors is connected to another serially in order to configure an amplifier of a multistage amplifier unit. At least one (final stage transistor) of the plurality of transistors is fixed one-sided closer to the semiconductor chip so that the wire for connecting the signal output electrode to its bonding pad becomes shorter than the wire for connecting the control electrode to its bonding pad.

Recesses are formed in the main surface of the wiring substrate and a metallized layer is formed partially at the bottom of each recess in the same size as that of the semiconductor chip. Then, a fusion bonding material is disposed on the metallized layer and a semiconductor chip is supplied on the fusion bonding material. The fusion bonding material is heated and fused temporarily to fix the semiconductor chip there. The metallized layer is formed so that its one side reaches one side of the inner wall of the recess. When the bonding material is heated and fused temporarily, the semiconductor chip is moved due to the self-alignment action of the fused bonding material driven by its surface tension, so that the centers of both chip and metallized layer are aligned when the chip is fixed on the metallized layer. At that time, the self-alignment action of the bonding material also drives the chip so that one side thereof comes in contact with one side of the inner wall of the recess when the chip is positioned in the recess. A plurality of such multistage amplifier units are built in each semiconductor chip and such semiconductor chips are built in a radio communication device.

According to the means (1) described above, the following effects are obtained.

(a) The parasitic inductance can be reduced by shortening the drain wire of the final stage transistor of each multistage amplifier unit. In other words, the drain wire is set shorter than the gate wire by fixing the semiconductor chip at a place one-sided closer to the drain bonding pad than the gate bonding pad and/or by making the distance of the drain electrode from the chip edge shorter than the distance of the gate electrode from the chip edge.

(b) The fixing position of each semiconductor chip is decided accurately by (1) the position of the metallized layer formed on the surface of the wiring substrate, (2) the metallized layer formed in the same size as that of the chip, and (3) the self-alignment action of the fusion bonding material put between the metallized layer and the semiconductor chip. In addition, in this embodiment, the semiconductor chip is positioned so that one side of the semiconductor chip, on which the drain electrode is disposed, comes in contact with one side of the inner wall of the recess formed in the wiring substrate, thereby the semiconductor chip comes to be positioned accurately.

More concretely, the metallized layer is extended up to the inner wall of the recess, which is closer to the drain bonding pad and in the same size as that of the semiconductor chip. Consequently, one side of the semiconductor chip put on the fusion bonding material comes in contact with the inner wall of the recess, which is closer to the drain bonding pad due to the self-alignment action of the bonding material driven by its surface tension.

Because the metallized layer extended in the direction for crossing the inner wall of the recess, which is closer to the drain bonding pad, is formed a little shorter than the semiconductor chip, one side of the semiconductor chip can come in contact with the inner wall of the recess, which is closer to the drain bonding pad by the self-alignment action of the bonding material due to its surface tension. Consequently, the drain wire for connecting the drain electrode of the semiconductor chip to the drain bonding pad provided on the surface of the wiring substrate is fixed in length, thereby the wire inductance is fixed. As a result, both output and efficiency of each communication system of the mobile phone in which the semiconductor device in this embodiment is built are fixed, thereby the characteristics of the mobile phone (radio communication device) are stabilized.

(c) According to the method for manufacturing a semiconductor device in this embodiment, a plurality of recesses are formed in the main surface of the wiring substrate and a metallized layer is formed in the same size as that of the semiconductor chip in each of the recesses so as to reach the inner wall of the recess, which is closer to the drain bonding pad. A fusion bonding material is put on the metallized layer and a semiconductor chip is supplied on the bonding material, then the bonding material is heated and fused temporarily so that the semiconductor chip is positioned and fixed accurately at the bottom of the recess due to the self-alignment action of the fused bonding material. Consequently, the semiconductor chip is fixed so that one side thereof comes in contact with the inner wall of the recess, which is closer to the drain bonding pad. Thus, the drain electrode of the semiconductor chip is always fixed and the drain wire is fixed in length, thereby the variation of the wire inductance is reduced. As a result, both efficiency and output of the mobile phone in which the semiconductor device in this embodiment is built are stabilized.

BRIEF DESCRIPTION OF THE DRAWINGS

FIGS. 24A and 24B are top and cross sectional views of denoting how a semiconductor chip is mounted in still another (fifth) embodiment;

FIG. 25 is an explanatory cross sectional view of a wire bonding portion in prior art of the present invention with respect to a problem that is examined;

BEST MODE FOR CARRYING OUT THE INVENTION

Figure 1:
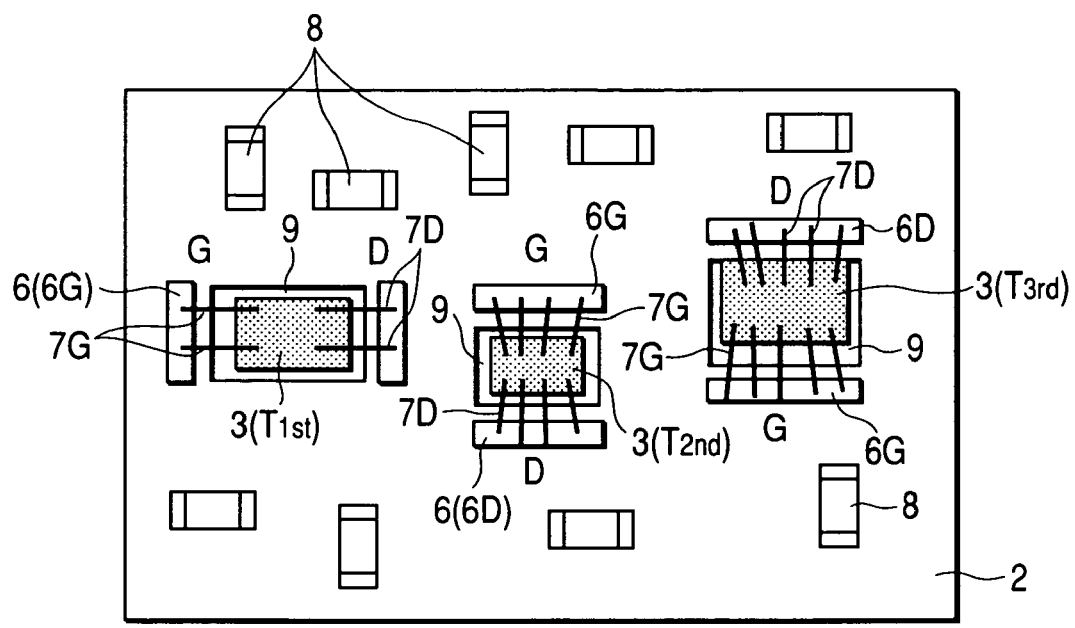
FIG. 1 is an explanatory top view of a semiconductor device in an embodiment (first embodiment) of the present invention, denoting how electronic parts are disposed on a module substrate.

Hereunder, the preferred embodiments of the present invention will be described in detail with reference to the accompanying drawings. In all the accompanying drawings for describing the embodiments of the present invention, the same reference numerals and symbols will be used for the same functional items, avoiding redundant description.

First Embodiment

FIGS. 1 through 15 relate to a semiconductor device (high frequency power amplification unit) including a multistage amplifier unit built therein, its manufacturing method, and a radio communication device (mobile phone) including the semiconductor device built therein in an embodiment (first embodiment) of the present invention.

At first, the semiconductor device that includes a multistage amplifier unit and its manufacturing method of the present invention will be described with reference to FIGS. 1 through 9 before describing the dual band high frequency power amplification unit and the mobile phone (radio communication device) of the present invention.

As shown in FIG. 1, the semiconductor device 1 in which a multistage amplifier unit is built includes various types of electronic parts mounted on the main surface of its module substrate 2 configured by a wiring substrate. Although this module substrate is not shown in FIG. 1, the main surface is capped to function as a single product while the module substrate 2 has external electrode terminals on its rear side (surface mounting structure). The wiring, etc. on the main surface of the module substrate 2 are omitted here.

As shown in FIG. 1, three semiconductor chips (semiconductor elements) 3 are mounted on the main surface of the module substrate 2. On each of the three semiconductor chips is provided one of the transistors ($T_{1st}$, $T_{2nd}$, and $T_{3rd}$) as the first, second, and final stage amplifiers. The three-stage amplifier unit is configured by those transistors. In this first embodiment, those transistors are all field-effect transistors (FET). At one side of the surface of the semiconductor chip 3 are disposed gate electrodes (G) (not shown) side by side and on the other side are disposed drain electrodes (D) (not shown) side by side. Each gate electrode also functions as a control electrode for receiving control signals and it is equivalent to the base electrode of a bipolar transistor. Each drain electrode outputs signals and it is equivalent to the collector electrode of a bipolar transistor.

Those electrodes are connected electrically to the bonding pads 6 formed on the surface of the module substrate 2 through conductive wires 7. Here, a bonding pad used for a gate will be referred to as a gate bonding pad 6G and a bonding pad used for a drain will be referred to as a drain bonding pad 6D. A wire for connecting a gate electrode to the gate bonding pad 6G will be referred to as a gate wire 7G and a wire for connecting a drain electrode to the drain bonding pad 6D will be referred to as a drain wire 7D. Although not distinguished here specially, chip parts 8 for forming chip resistors, chip capacitors, etc. are also mounted on the main surface of the module substrate 2.

Figure 2:
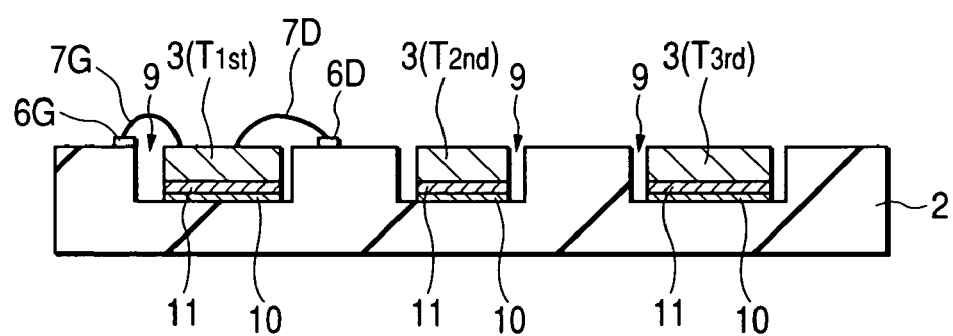
FIG. 2 is a cross sectional view of the module substrate.

FIG. 2 shows an explanatory cross sectional view of an assembly configured by a module substrate 2 and semiconductor chips 3 in which the transistors ($T_{1st}$, $T_{2nd}$, and $T_{3rd}$) are built and disposed in the first, second, and final stage amplifiers. Each semiconductor chip 3 is fixed at the bottom of a recess 9 formed in the main surface of the module substrate 2. In this first embodiment, a metallized layer 10 is formed partially at the bottom of each rectangular recess 9 and a fusion bonding material 11 is disposed on this metallized layer 10, then, a semiconductor chip 3 is put on the fusion bonding material 11. The fusion bonding material 11 is fused temporarily to fix the semiconductor chip 3 on the metallized layer 10 with its self-alignment action by its surface tension. Consequently, the sizes of both metallized layer 10 and fusion bonding material 11 are selected properly.

Figure 3:
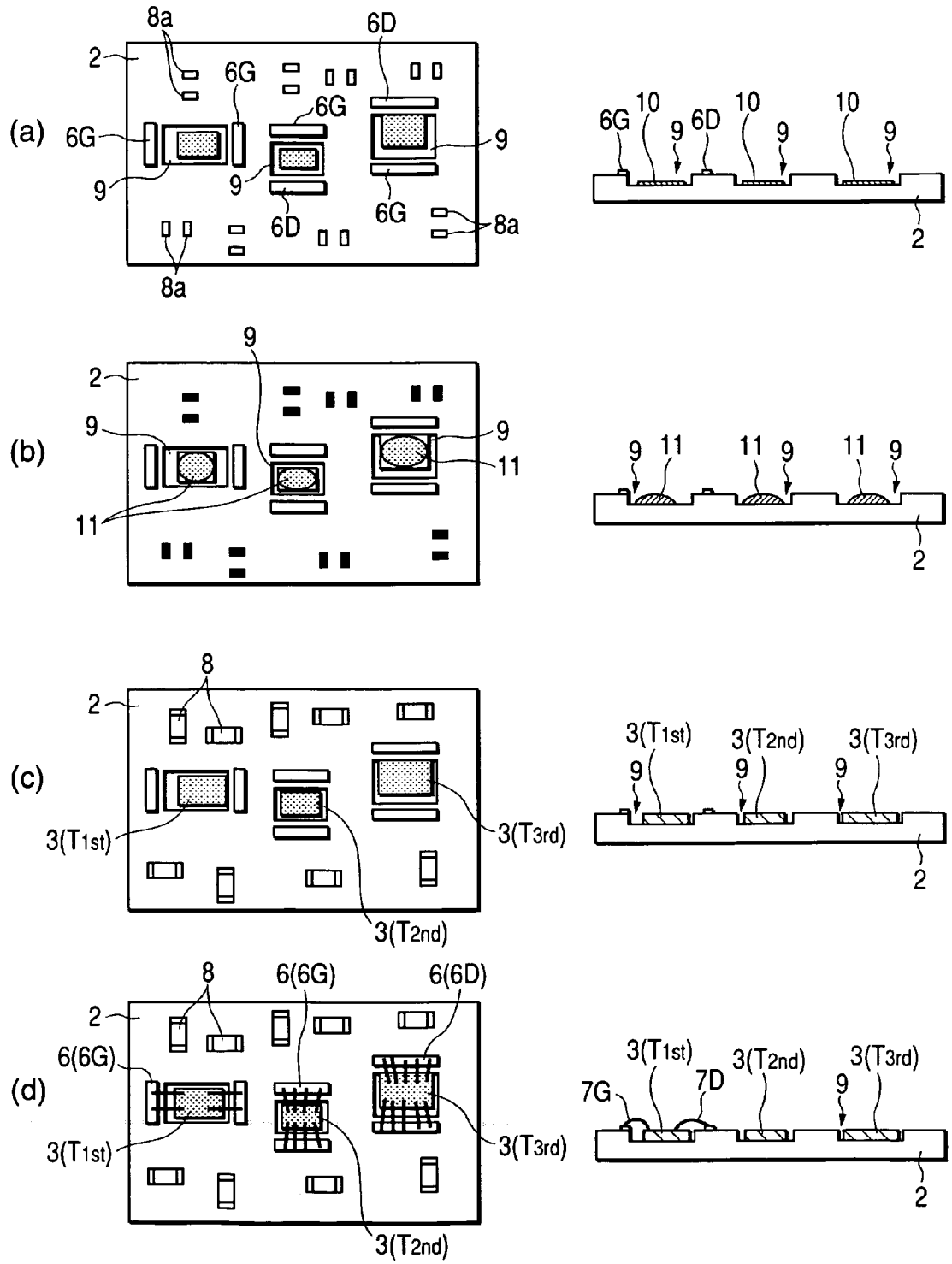
FIGS. 3A through 3D are pairs of top and cross sectional views in some manufacturing processes for the semiconductor device in the first embodiment of the present invention.
Figure 4:
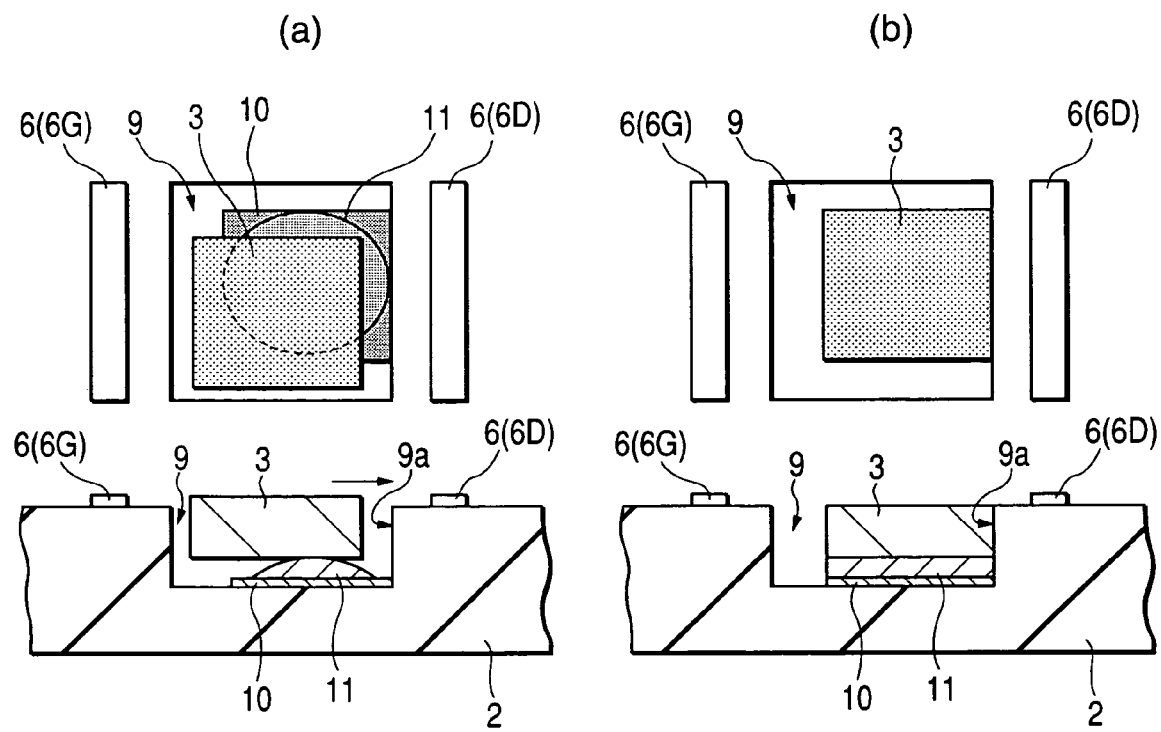
FIGS. 4A and 4B are pairs of explanatory top and cross sectional views of how a semiconductor chip is fixed in a manufacturing process of the semiconductor device in the first embodiment of the present invention.

Hereunder, how to mount a semiconductor chip will be described with reference to some of the manufacturing processes of the semiconductor device shown in FIG. 3, as well as an explanatory view of how the semiconductor chips are fixed there as shown in FIG. 4. FIGS. 3A through 3D show some processes for manufacturing the semiconductor device. The left side illustrations are all top views while the right side illustrations are all cross sectional views.

As shown in FIG. 3A, the recesses 9 are formed in the top face (main surface) of the module substrate 2 in accordance with FIG. 1. At the bottom of each recess 9 and on the main surface of the module substrate 2 are formed a metallized layer for fixing a semiconductor chip 3 and bonding pads 6 for connecting wires (drain bonding pad 6D and gate bonding pad 6G), and a pair of electrode pads 8a for fixing a pair of electrodes of a chip part 8.

The metallized layer 10, the bonding pads 6, and the pair of electrode pads 8a are formed through screen-printing of silver paste (or copper paste or the like) at a thickness of about 15 μm.

The metallized layer 10 formed at the bottom of each recess 9 is the same in size as the semiconductor chip 3 to be fixed there. However, even when the metallized layer 10 is formed a little larger than the semiconductor chip 3, the semiconductor chip can be fixed due to the self-alignment action of the fused bonding material 11 so that the center of the semiconductor chip is aligned to the center of the metallized layer. If the semiconductor chip 3 can discharge its generated heat therefrom effectively, the metallized layer 10 may be a little smaller than the semiconductor chip 3.

In the recess 9 in which a semiconductor chip 3 that includes the first stage amplifier transistor, the metallized layer 10 is slightly one-sided closer to the drain bonding pad 6D. However, the edge of the metallized layer 10 never comes in contact with the inner wall of the recess 9 even at that time.

In the recess 9 in which a semiconductor chip 3 that includes the second stage amplifier transistor, the metallized layer 10 is aligned to the center of the recess and the edge of the layer 10 never comes in contact with the inner wall of the recess 9.

In the recess 9 in which a semiconductor chip 3 that includes the final stage amplifier transistor, the metallized layer 10 is extended up to the inner wall of the recess 9, which is closer to the drain bonding pad 6D (see FIG. 4A).

Next, as shown in FIG. 3B, a predetermined amount of fusion bonding material 11 is supplied on the metallized layer at the bottom of the recess 9 with use of a dispenser. The fusion bonding material 11 is, for example, silver paste. In the right illustration in FIG. 3B, the metallized layer 10 is omitted.

After that, as shown in FIG. 3C, a semiconductor chip 3 is put on the fusion bonding material 11 disposed on the metallized layer 10 in each recess 9, then the fusion bonding material 11 is heated and fused at a predetermined temperature temporarily so that the semiconductor chip 3 is positioned and fixed appropriately on the metallized layer 10 by the fused bonding material 11. In the right side illustration in FIG. 3C, both of the metallized layer 10 and the fusion bonding material 11 are omitted; only the semiconductor chip 3 is shown.

FIGS. 4A and B show are explanatory views of a semiconductor chip that includes the final stage amplifier transistor before and after it is fixed. FIG. 4A shows the semiconductor chip put on the fusion bonding material 11. The upper illustration shows a top view and the lower illustration shows a cross sectional view of the semiconductor chip. FIG. 4B shows the semiconductor chip fixed already on the fusion bonding material 11. The upper illustration shows a top view and the lower illustration shows a cross sectional view of the semiconductor chip.

As shown in the lower illustration of FIG. 4B, the semiconductor chip 3 mounted on the fusion bonding material 11 moves on the fusion bonding material 11 to the right as denoted by an arrow since the fused bonding material 11 gets wet and spreads all over the back surface of the semiconductor chip 3 in accordance with fusion due to heating of the fusion bonding material 11 and the self-alignment action acts such that the center of the semiconductor chip 3 is aligned to the center of the metallized layer 10 that is assumed as a chip seat due to its surface tension of the fused bonding material 11.

The metallized layer 10 is extended up to the inner wall (one side of the inner wall) of the recess 9, which is closer to the drain bonding pad 6D. Consequently, the moving semiconductor chip 3 comes in contact with one side 9a of the inner wall and it is fixed naturally there (see FIG. 4B). The drain-electrode-formed one side of the semiconductor chip 3 that includes the final stage amplifier transistor comes in contact with the inner wall at one side 9a of the inner wall 9, which is closer to the drain bonding pad 6D. The semiconductor chip 3 is thus fixed there very accurately. As a result, the distance between the drain electrode of the transistor of the final stage amplifier and the drain bonding pad 6D is fixed.

After that, as shown in FIG. 3D, the electrode provided on the top face of each semiconductor chip 3 is connected to the bonding pad 6 provided on the top face of the module substrate 2 through a conductive wire. In other words, a gate electrode (not shown) and the gate bonding pad 6G are connected to each other through the gate wire 7G and a drain electrode (not shown) and the drain bonding pad 6D are connected to each other through the drain wire 7D. In FIG. 3D, some of reference numerals/symbols are omitted, since the illustration is to become unclear. The details of the left side illustration in FIG. 3D is as shown in FIG. 1. And, in the right side illustration in FIG. 3D, both of the metallized layer 10 and the fusion bonding material 11 are omitted; only the semiconductor chip 3 is shown.

The position of the drain electrode of the final stage transistor is always fixed, since one side of the semiconductor chip 3, which is closer to the drain bonding pad 6D, is in contact with the side 9a of the inner wall assumed as a reference plane. Consequently, the length of the wire for connecting the drain bonding pad 6D to the drain electrode is always fixed, thereby the variation of the parasitic inductance is suppressed.

Furthermore, the periphery of each recess 9 snags when it is baked in a manufacturing process of the module substrate 2. To avoid this, therefore, the bonding pad 6 to be provided must be separated from the periphery by a predetermined distance "a". This is why the bonding wire becomes long. However, in the case of the semiconductor chip 3 that includes the final stage transistor, one side of the semiconductor chip 3, which is closer to the drain bonding pad 6D, comes in contact with the inner wall of the recess 9, which is closer to the drain bonding pad 6D, so that the wire is reduced in length. The wire inductance of the semiconductor device is thus reduced.

Figure 5:
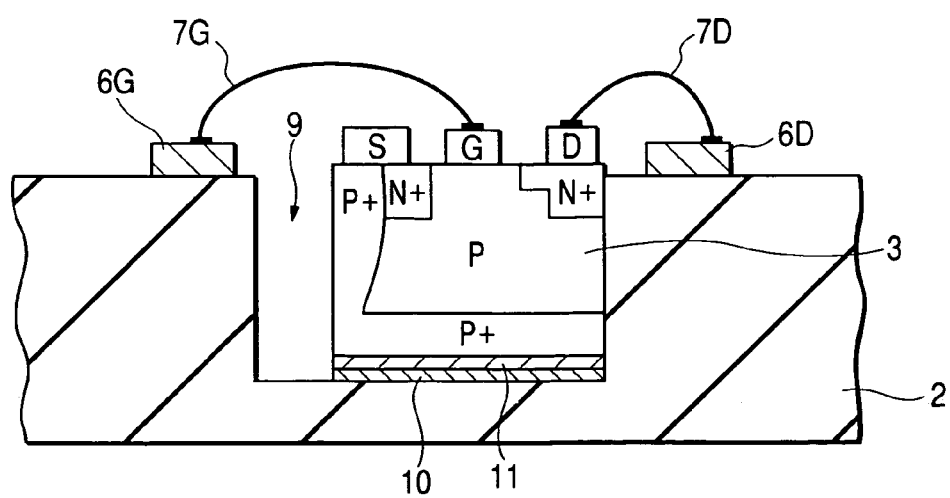
FIG. 5 is an explanatory cross sectional view of how a semiconductor element is fixed in the semiconductor device in the first embodiment of the present invention.

FIG. 5 shows an explanatory cross sectional view of a FET (semiconductor chip) to be fixed in a recess 9. One side of the semiconductor chip 3, which is closer to the drain bonding pad 6D, comes in contact with one side 9a of the inner wall of the recess, which is closer to the drain bonding pad 6D. Consequently, the drain wire 7D is always fixed in length.

As described above, the semiconductor chip 3 can be put on the metallized layer 10 having the same size as that of the semiconductor chip 3 so that their centers are aligned due to the self-alignment action of the fused fusion bonding material 11 driven by its surface tension. Consequently, the semiconductor chip 3 comes to be positioned and fixed very accurately.

The semiconductor chip 3 of the first stage amplifier is positioned one-sidedly to the drain bonding pad 6D than the gate bonding pad 6G, since the distance from the drain pad 6D is shorter than the distance from the gate bonding pad 6G.

The semiconductor chip 3 of the second stage amplifier is positioned at the center point between the drain bonding pad 6D and the gate bonding pad 6G.

The semiconductor chip 3 of the final stage amplifier is positioned closer to the drain bonding pad 6D than the gate bonding pad 6G, since the distance from the drain bonding pad 6D is shorter than the distance from the gate bonding pad 6G.

Generally, a semiconductor chip is supplied in each recess 9 by a vacuum suction collet of a chip bonding device. In other words, a semiconductor chip is vacuum-sucked at the lower end of the collet, then the collet is moved onto the metallized layer by moving an arm that supports the collet. Then, the vacuum suction is reset to put the semiconductor chip 3 on the metallized layer. This positing accuracy is determined by the moving accuracy of the arm of the chip bonding device.

However, the semiconductor chip fixing position is decided by both position and size of the metallized layer and the self-alignment action of the fusion bonding material 11, so that highly accurate chip bonding is realized even when the accuracy of the chip positioning by the chip bonding device is low.

However, in the case where a metallized layer 10 is formed all over the bottom of the recess 9, the fusion bonding material 11 is supplied in the center of the recess 9 with use of a dispenser, a semiconductor chip 3 is placed on the fusion bonding material 11, and the bonding material 11 is heated to bond the chip 3 or a fusion bonding material 11 supplied to the back face of the semiconductor chip 3 is fused to fix the semiconductor chip 3 on the metallized layer 10, the position of the semiconductor chip 3 comes to be varied according to where the semiconductor chip is placed in the recess 9 and/or how the fusion bonding material 11 is fused. As a result, the length of the wire for connecting the electrodes of the semiconductor chip 3 to the bonding pads provided on the main surface of the module substrate 2 comes to be varied.

In other words, if a semiconductor chip is supplied in a recess 9, the position of the semiconductor chip 3 might be varied typically in the following three ways. At first, as shown in FIG. 7B, the center of the semiconductor chip 3 is positioned in the center of the recess 9 (center state B). And, as shown in FIG. 7A, the left end of the semiconductor chip 3 comes in contact with the inner wall of the recess 9, which is closer to the gate bonding pad 6G (left-sided state A). Then, as shown in FIG. 7C, the right end of the semiconductor chip 3 comes in contact with the inner wall of the recess 9, which is closer to the drain bonding pad 6D (right-sided state C). Consequently, the gate wire 7G and the drain wire 7D come to be varied in length respectively.

Figure 6:
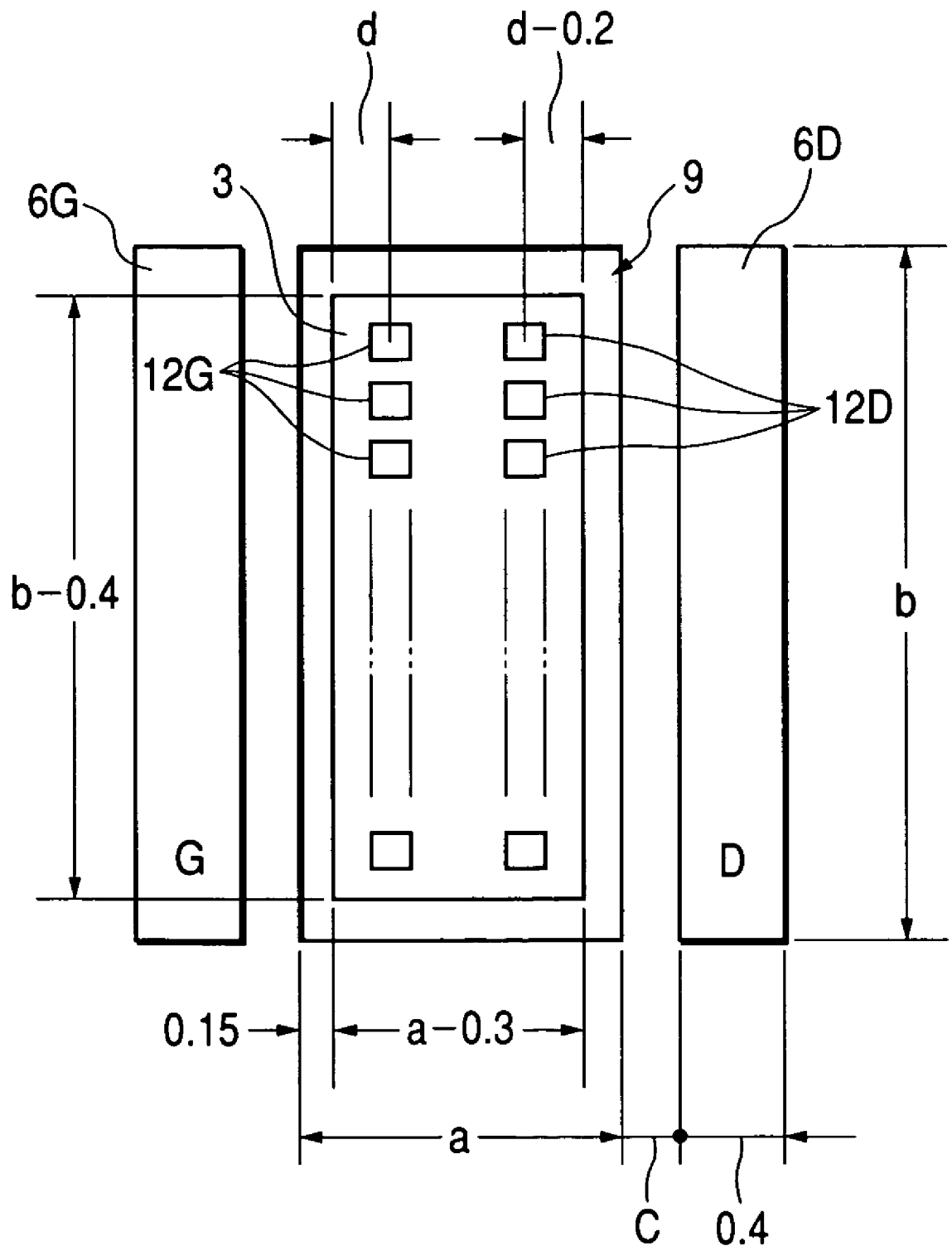
FIG. 6 is an explanatory view of a positional relationship among an electrode, a gate bonding pad, and a drain bonding pad of a semiconductor element provided in the semiconductor device in the first embodiment of the present invention.
Figure 7:
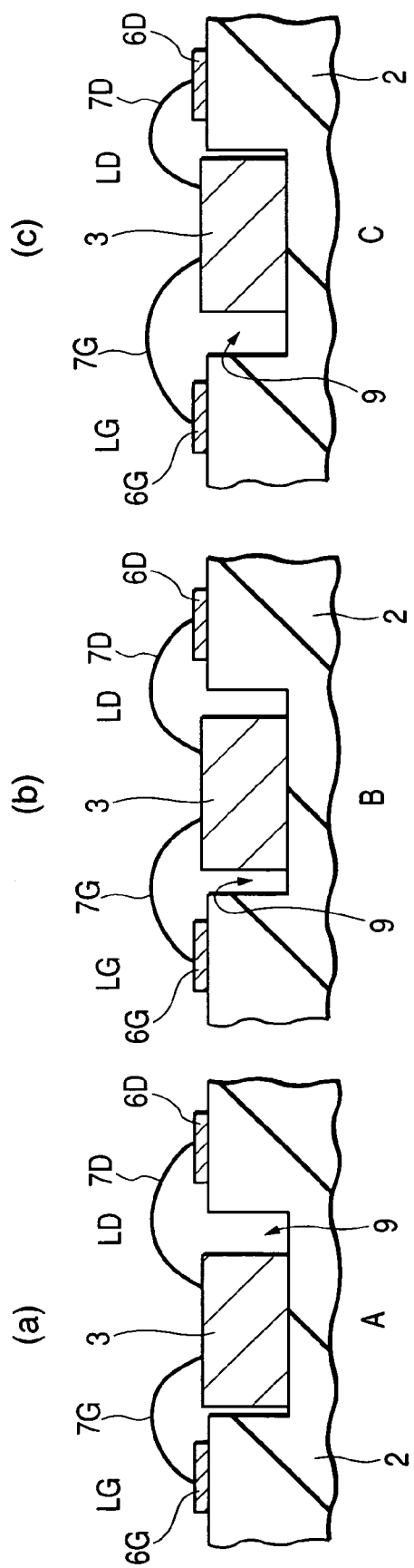
FIGS. 7A through 7C are illustrations for denoting a difference between a gate wire (LG) and a drain wire (LD) to be caused by the fixing position of the semiconductor element.

FIG. 6 shows an example of the size of each part of the semiconductor chip 3 that includes the final stage transistor. The 1.0 mm×2.5 mm semiconductor chip 3 is supplied in a 1.3 mm×2.9 mm recess 9. Outside both ends of the recess 9 are disposed a 0.4 mm×2.9 mm gate bonding pad 6G and a same size drain bonding pad 6D apart from the edge of the recess 9 by 0.2 mm respectively.

At both ends of the semiconductor chip 3 are disposed wire bonding pads side by side along the periphery of the chip 3. A gate wire bonding pad 12G faces the gate bonding pad 6G and a drain wire bonding pad 12D faces the drain bonding pad 6D. Each wire bonding pad is connected to another through a conductive wire. The wire is, for example, a metal line having a diameter of 27 μm.

The distance between the center of the gate wire bonding pad 12G and the edge of the chip 3, which is closer to the gate bonding pad 6G, is dmm while the distance between the center of the drain wire bonding pad 12D and the edge of the chip 3, which is closer to the drain bonding pad 6D, is d-0.2 mm. This is to obtain an effect for reducing the drain side parasitic inductance of the chip 3.

Figure 8:
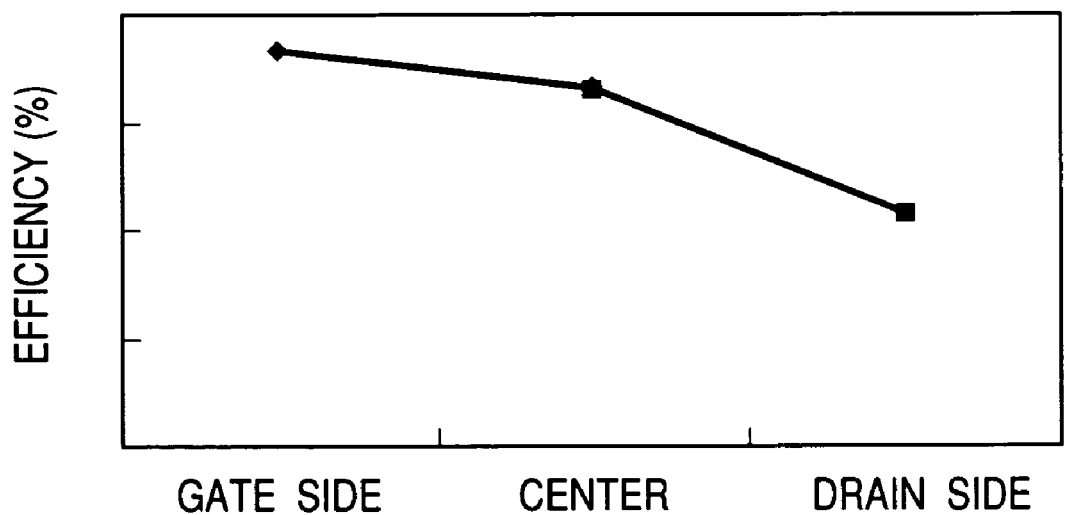
FIG. 8 is a graph for denoting changes of both fixing position and efficiency of the semiconductor element.
Figure 9:
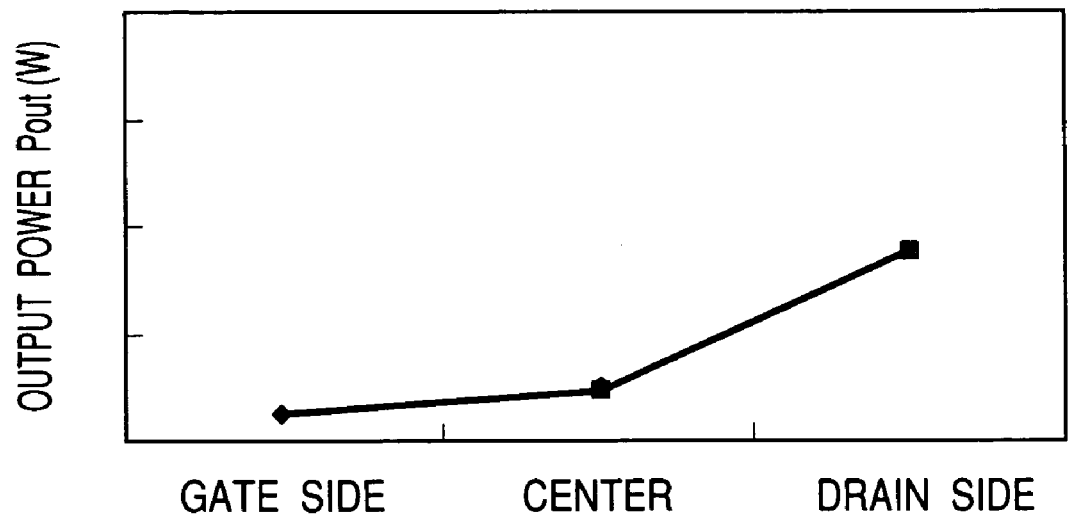
FIG. 9 is a graph for denoting changes of both fixing position and output power of the semiconductor element.

Because the size of each part of the chip is related to another such way, the chip supply position is any of the left sided supply state A, the center supply state B, and the right sided supply state C as shown in FIGS. 7A through 7C, the efficiency (%) becomes as shown in a graph in FIG. 8 and the output power (W) becomes as shown in a graph in FIG. 9.

In other words, as shown in FIG. 7B, if it is assumed that the gate wire 7G is Amm and the drain wire 7D is B in length while the semiconductor chip 3 is positioned in the center of the recess 9, the efficiency and the output power that are characteristics of the main module are η% and PW respectively.

As shown in FIG. 7A, if the position of the semiconductor chip 3 is adjusted so that the chip 3 comes in contact with the left side inner wall of the recess 9 (left sided state A)(the chip is positioned closer to the gate bonding pad 6G), the gate wire 7G becomes 0.9 Amm and the drain wire 7D becomes 1.15 Bmm in length respectively, thereby the efficiency is improved by 1% and the output power is reduced by 3% in the absolute value comparison.

And, as shown in FIG. 7C, if the semiconductor chip 3 is positioned in contact with the right side inner wall of the recess 9 (right sided state)(the chip 3 is positioned closer to the drain bonding pad 6D), the gate wire 7G becomes 1.14 Amm and the drain wire 7D becomes 0.83 Bmm. Thus, the efficiency is reduced by 4% and the output power is improved by 8% in the absolute value comparison.

In the first embodiment, if the semiconductor chip 3 that includes the final stage transistor is positioned in the recess 9 so as to be closer to the drain bonding pad 6D, the output power has increased more significantly compared with the conventional 3.2 W. This is to increase the output power to 4.1 W or over in the GSM (Global System for Mobile Communication) in the dual band high frequency power amplification unit to be described later. The 4.1 W or over is far higher than the general output power of 3.2 W. Although the efficiency falls slightly in this case, such a fall will not arise any problem in the communication system.

In this first embodiment, at least one of the three semiconductor chips is positioned in the recess so that one side thereof comes in contact with one side of the inner wall of the recess. In other words, in order to fix the parasitic inductance (wire inductance) of the drain of the final stage transistor that affects both output and efficiency of the multistage amplifier, one side of the semiconductor chip 3, which is closer to the drain bonding pad 6D, is put in contact with one side of the inner wall of the recess 9. Consequently, one side of the metallized layer is extended up to the inner wall of the recess 9, which is closer to the drain bonding pad 6D. Consequently, one side of the semiconductor chip put on the fused fusion bonding material comes in contact with the inner wall of the recess 9, which is closer to the drain bonding pad 6D, due to the self-alignment action of the fusion bonding material by its surface tension.

Next, a description will be made for the dual band high frequency power amplification unit and the mobile phone (radio communication device) of the present invention with reference to FIGS. 10 through 15.

The semiconductor device, which is a concrete example in this first embodiment, is a dual band high frequency power amplification unit used for a mobile phone (radio communication device) that includes a multistage amplifier for GSM and DCS (Digital Cellular System) communication systems.

Figure 10:
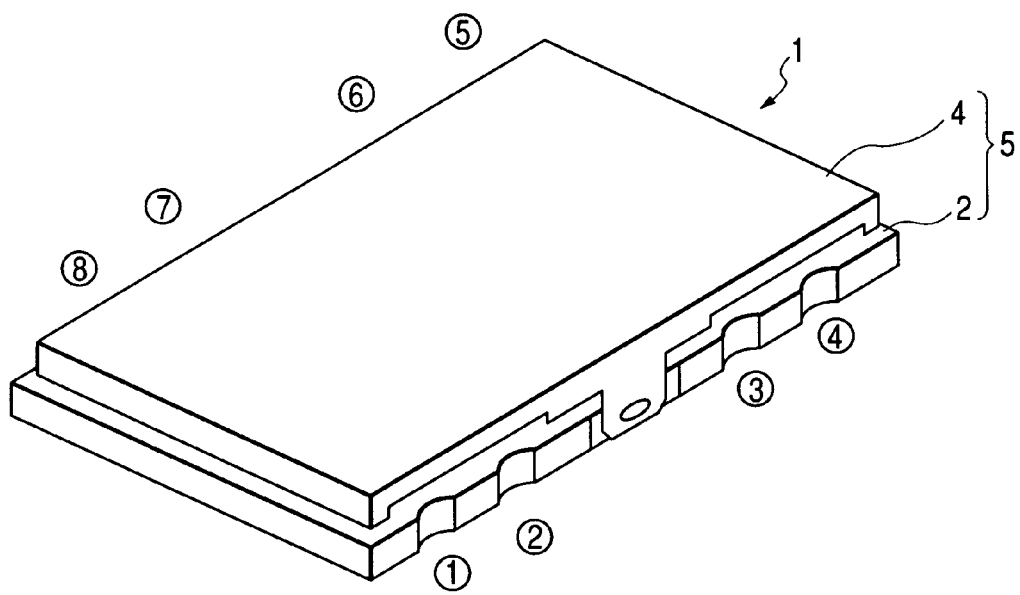
FIG. 10 is a perspective view of an external appearance of a high frequency power amplification unit (semiconductor device) in the first embodiment of the present invention.

As shown in FIG. 10, the semiconductor device (high frequency power amplification unit: high frequency power amplification module) 1 in this first embodiment is housed in a flat rectangular package 5 configured by a module substrate 2 comprising a ceramic wiring board as described above and a cap 4 attached on one side (main surface) of the module substrate 2. The cap 4 is made of metal that functions as an electromagnetic shield and press-molded.

Figure 14:
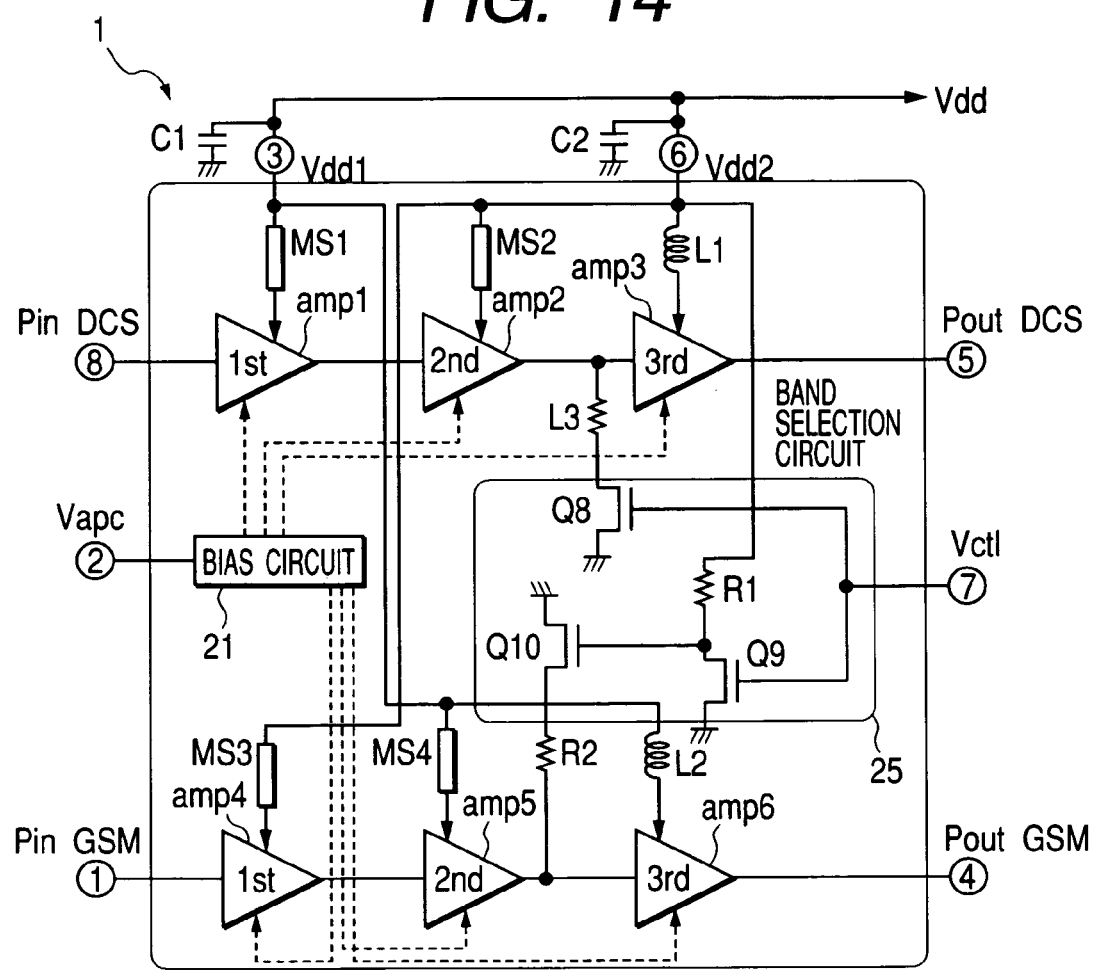
FIG. 14 is a circuit diagram of the high frequency power amplification unit.

FIG. 14 is a circuit diagram of the high frequency power amplification unit in the first embodiment. This high frequency power amplification unit 1 includes external electrode terminals that are a GSM input terminal (Pin GSM(1)), a control terminal (Vapc (2)), one terminal (Vdd1 (3)) of supply voltage terminals Vdd, a GSM output terminal (Pout GSM (4)), a DCS output terminal (Pout DCS (5)), the other terminal (Vdd2 (6)) of supply voltage Vdd, a communication band change-over terminal (Vct1 (7)), a DCS input terminal (Pin DCS (8)), and a ground voltage terminal (GND)(not shown). The terminals are disposed like (1), (2), (3), and (4) from left to right on this side of the module substrate 2 and like (5) to (8) from right to left on the other side of the module substrate 2 as shown in FIG. 1.

Both DCS and GSM employ a three-stage amplifier configuration as described previously. The DCS amplification system is configured by amplification stages (amp1, amp2, and amp3) denoted by the 1st, 2nd, and 3rd transistors. The GSM amplification system is configured by amplification stages (amp4, amp5, and amp6) denoted by the 1st, 2nd, and 3rd transistors. Each amplification stage is configured by a field-effect transistor (FET) formed on a silicon substrate. FIG. 5 shows an explanatory cross sectional view of a FET semiconductor chip 3 and how the chip is fixed at the bottom of a recess 9 and how the gate wire 7G and the drain wire 7D thereof are connected.

In such a multistage amplifier configuration, the PinDCS (8) is connected to amp1 and the PoutDCS (5) is connected to amp3. The PinGSM (1) is connected and the PoutGSM (4) is connected to amp6.

The Vapc (2) is connected to the bias circuit 21 and both amp1 to amp6 are controlled by the signals inputted to this Vapc (2).

The Vdd1 (3) is connected to amp1 through the micro-strip line MS1, to amp5 through the micro-strip line MS4, and to amp6 through an inductor L2 respectively. An external capacitor C1 is connected to the Vdd1 (3) to stabilize the high frequency characteristics. One end of the capacitor C1 is connected to the GND.

The Vdd2 (6) is connected to the amp4 through a micro-strip line MS3, to the amp2 through a micro-strip line MS2, and to the amp3 through an inductor L1 respectively. An external capacitor C2 is connected to the Vdd2 (6) to stabilize the high frequency characteristics. One end of the capacitor C2 is connected to the GND.

In this manner, two terminals (Vdd1 (3) and Vdd2 (6)) are prepared for the supply voltage Vdd and one of the terminals supplies a supply voltage to the first stage amplifier of one amplification system and the second and third stage amplifiers of the other amplification system while the other supply voltage terminal supplies a supply voltage to the first stage amplifier of the other amplification system and the second and third stage amplifiers of one amplification system (so-called crossed configuration). Consequently, the return of leak signals to the first stage amplifier from a subsequent stage amplifier (especially the final stage amplifier) through a power supply line is prevented, thereby the oscillation margin is improved.

The Vct1 (7) is connected to a band selection circuit 25. This band selection circuit 25 is configured by three n-channel field-effect transistors (FET) Q8 to Q10 and one resistor R1. The source terminal of each of the Q8 to Q10 is connected to that of another. The gate terminals of both Q8 and Q9 are connected to the Vct1 (7). The gate terminal of the Q10 is connected to the drain terminal of the Q9 and the drain terminal of the Q10 is connected to the output of the amp5 through the resistor R2. The drain terminal of the Q9 is connected to the Vdd2 (6) through the resistor R1. The drain terminal of the Q8 is connected to the input of the amp3 through the inductor L3. The signals inputted to the Vct1 (7) are used to change a band to another and amplify signals for the DCS or GSM communication.

Figure 11:
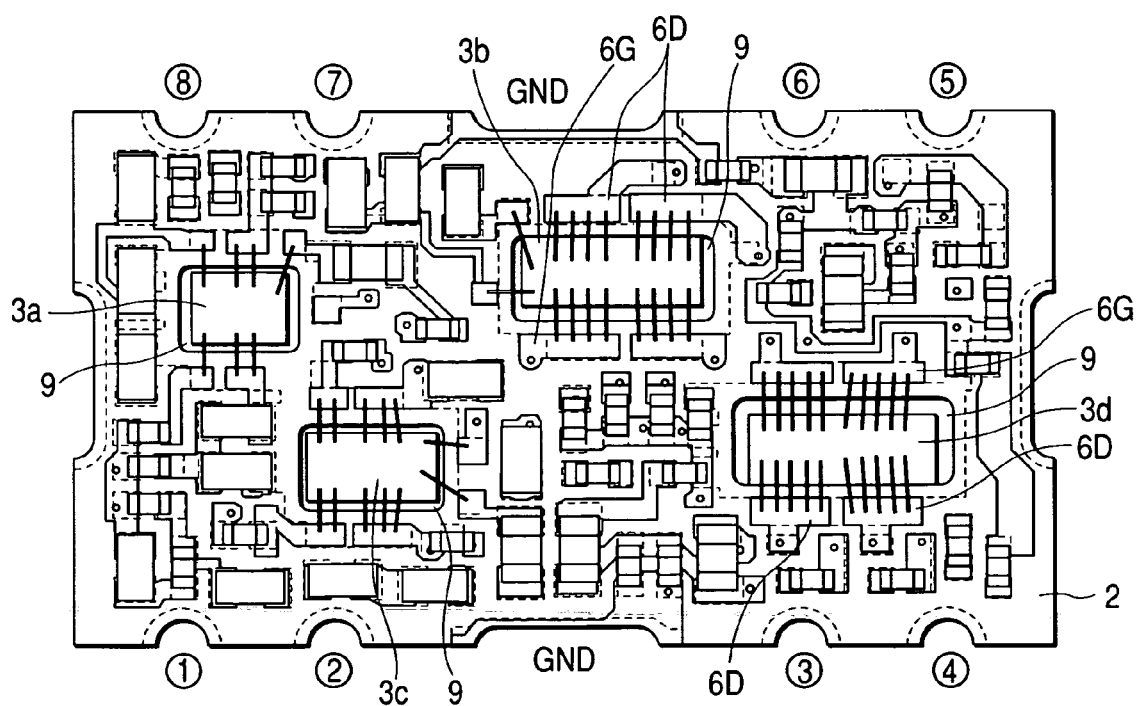
FIG. 11 is a top view of electronic parts laid out on the module substrate of the high frequency power amplification unit.

FIG. 11 shows a top view of each electronic part mounted on the surface of the module substrate 2 configured by a low-temperature-burned ceramic wiring board formed by laminating glass ceramics. As shown in FIG. 11, four semiconductor chips 3a to 3d, as well as many chip resistors and capacitors with no reference numeral/symbol provided are mounted on the surface of the module substrate 2. In addition to both top and back surfaces, conductors are also formed selectively inside the module substrate 2. A wiring (with no reference numeral/symbol provided) is formed by those conductors. Part of the wiring is a metallized layer used to fix the semiconductor chips as described above, electrode pads for fixing the electrodes of chip type electronic parts such as chip resistors, chip capacitors, etc., or bonding pads for connecting an end of each wire. The other end of the wire is connected to the electrode (not shown) of any of the semiconductor chips 3a to 3d. Surface-mounting type electrodes are formed by the wiring at the rear side of the module substrate 2 as external electrode terminals (1) to (8). Those external electrode terminals are formed in an LGA (Land Grid Array) structure.

The semiconductor chips 3a to 3d are fixed at the bottoms of recesses 9 formed in the main surface of the module substrate 2. In a semiconductor chip that generates much heat at its operation time, via holes are formed in the module substrate 2 under the chip, and the semiconductors are filled in those via holes, so that the heat is transmitted to the rear side of the module substrate 2.

The semiconductor chip 3b includes the final stage transistor of the multistage amplifier unit of the DCS communication system. The semiconductor chip 3d includes the final stage transistor of the multistage amplifier unit of the GSM communication system. In each of those semiconductor chips 3b and 3d, one side thereof, which is closer to the drain bonding pad 6D comes in contact with the inner wall of the recess 9, which is closer to the drain bonding pad 6D, so as to reduce the drain inductance and set it at a predetermined value as described above.

Figure 12:
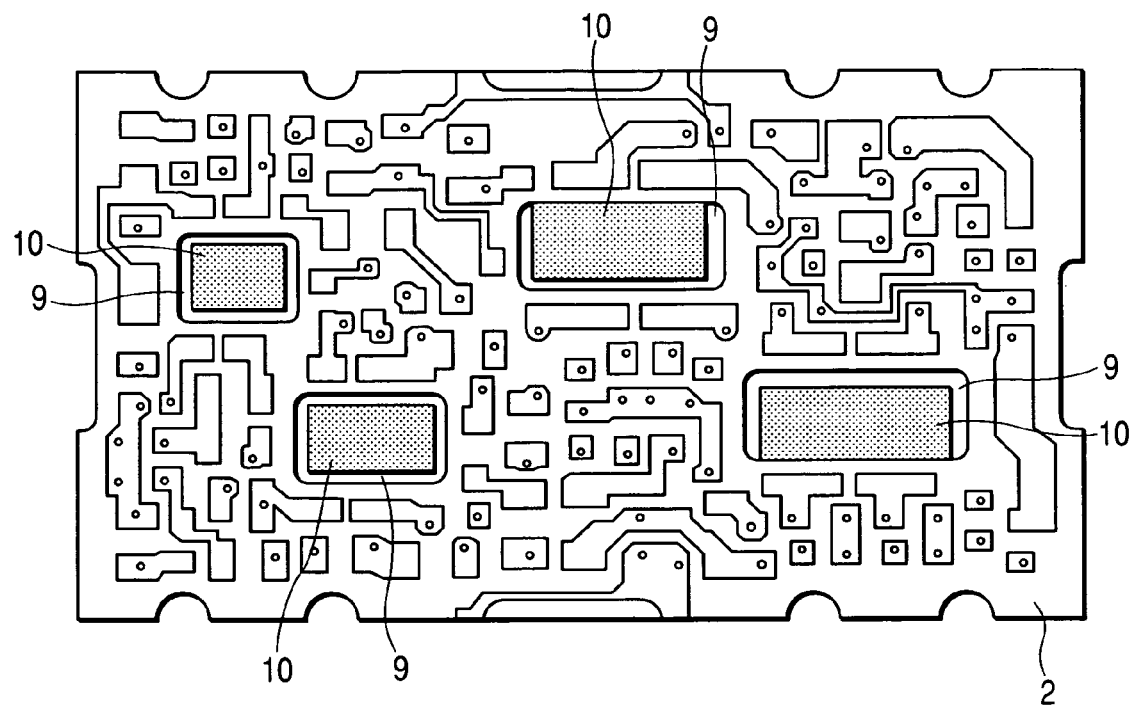
FIG. 12 is a top view of the module substrate of the high frequency power amplification unit.

FIG. 12 shows a top view of the module substrate of the high frequency power amplification unit. A wiring pattern is formed on the surface of the module substrate 2, although no reference numeral/symbol is given to it. And, four recesses 9 are formed in the surface so as to fix the semiconductor chips 3a to 3d therein. The portion denoted by a dotted line at the bottom of each recess 9 is a metallized layer 10.

Figure 13:
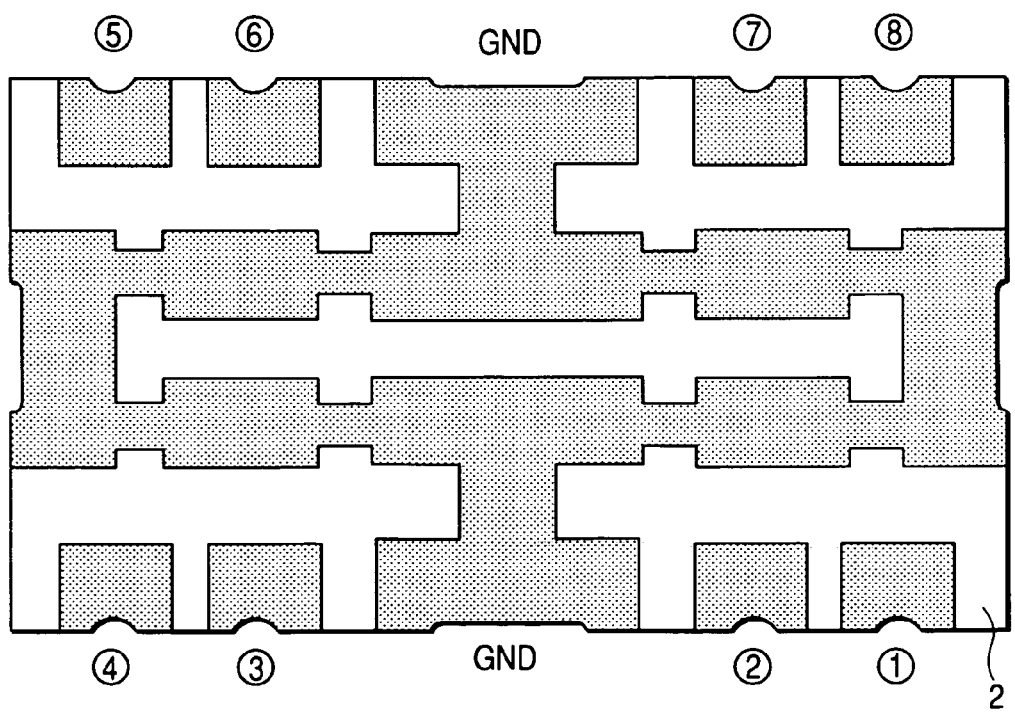
FIG. 13 is a bottom view of the module substrate.

FIG. 13 shows a bottom view of the module substrate 2, denoting electrode patterns for fixing parts mounted on the surface. Each dark portion denotes an electrode.

Figure 15:
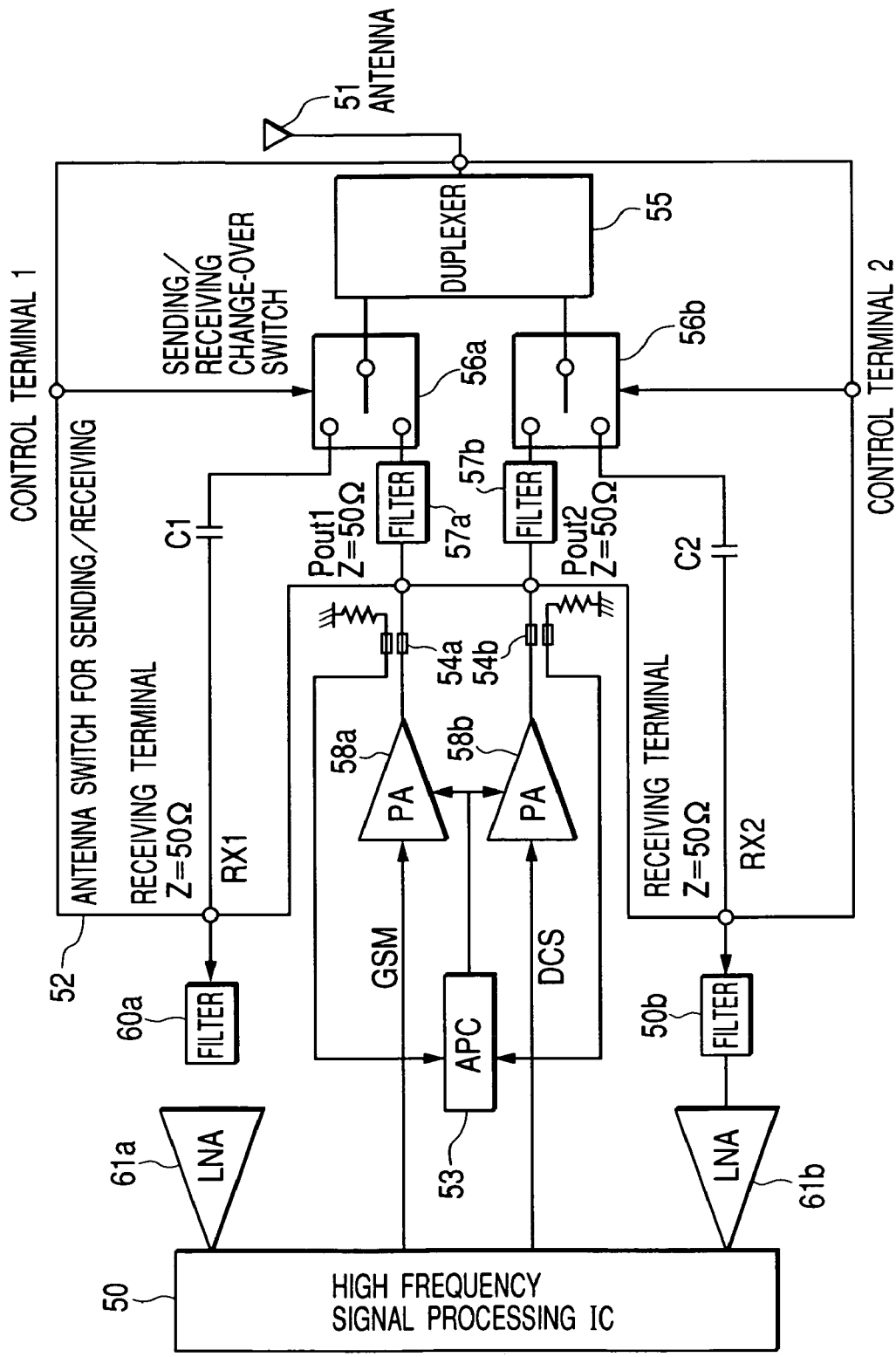
FIG. 15 is a block diagram of part of a mobile phone in which the high frequency power amplification unit is built.

Next, a description will be made for a mobile phone (radio communication device) in which the high frequency power amplification unit 1 is built. FIG. 15 shows a block diagram of the mobile phone system. Concretely, FIG. 15 shows a configuration of the mobile phone (mobile communication terminal) system.

The block diagram shown in FIG. 15 is for part of a dual band radio communication device, which includes a section between a high frequency signal processing IC (RF linear) 50 and an antenna 51. In FIG. 15, the amplification system of the high frequency power amplification device is divided into the GSM amplification system and the DCS amplification system. The amplifiers are denoted as PA (Power Amplifiers) 58a and 58b.

The antenna 51 is connected to an antenna terminal "Antenna" of an antenna sending/receiving switch 52 includes terminals Pout1 and Pout2 for receiving outputs from both PA 58a and 58b, receiving terminals RX1 and RX2, and control terminals control1 and control2.

GSM signals received from the high frequency signal processing IC 50 are transferred to the PA 58a, then output to the Pout1. The output of the PA 58a is detected by a coupler 54a and detected signals are fed back to an automatic output control circuit (APC circuit). The APC circuit 53 controls the PA 58a according to the detected signals.

DCS signals received from the high frequency signal processing IC 50 are transferred to the PA 58b, then output to the Pout2. The output of the PA 58b is detected by a coupler 54b and the detected signals are fed back to the APC circuit 53. The APC circuit 53 controls the PA 58b according to the detected signals.

The antenna sending/receiving switch 52 includes a duplexer 55. The duplexer 55 includes three terminals. One of the terminals is connected to the antenna terminal "Antenna" and one of the rest terminals is connected to the GSM sending/receiving switch 56a while the other is connected to the DCS sending/receiving switch 56b.

A contact "a" of the switch 56a is connected to the Pout1 through a filter 57a. The contact "b" of the switch 56a is connected to a receiving terminal RX1 through a capacitor C1. The switch 56a is connected to the contact "a" or "b" electrically according to the control signal inputted to the control terminal control 1.

The contact "a" of the switch 56b is connected to the Pout2 through a filter 57b. The contact "b" of the switch 56b is connected to a receiving terminal RX2 through a capacitor C2. The switch 56b is connected to the contact "a" or "b" electrically according to the control signal inputted to the control terminal control 2.

A filter 60a and a low noise amplifier (LNA) 61a are connected in order between the receiving terminal RX1 and the high frequency signal processing IC 50. A filter 60b and a low noise amplifier (LNA) 61b are connected in order between the receiving terminal RX2 and the high frequency signal processing IC 50. This radio communication device thus enables both GSM and DCS communications.

In this first embodiment, the semiconductor device can have the following effects.

(1) It is possible to reduce the parasitic inductance, since the drain wire 7D of the final stage transistor of the multi-stage amplifier is shortened. In other words, because the semiconductor chip 3 is fixed at a position one-sided closer to the drain bonding pad 6D than the gate bonding pad 6G and the distance from the edge of the semiconductor chip 3 of the drain electrode is set shorter than the edge of the semiconductor chip 3 of the gate electrode, thereby the drain wire 7D is set shorter than the gate wire 7G. As a result, the parasitic inductance of the drain wire 7D is reduced.

(2) Whether or not each semiconductor chip is fixed accurately is determined by the position of the metallized layer 10 formed on the surface of the wiring substrate (module substrate 2) and the size of the metallized layer that is expected to be the same as that of the semiconductor chip 3. In other words, the semiconductor chip 3 is positioned and fixed accurately by the self-alignment action of the fused bonding material 11 provided between the metallized layer 10 and the bottom face of the semiconductor chip 3. The self-alignment action of the bonding material 11 is by the surface tension thereof.

(3) In this first embodiment, because one peripheral side of the semiconductor chip 3, on which the drain electrode is provided, comes in contact with one side of the inner wall of the recess 9 formed in the surface of the module substrate 2, thereby the semiconductor chip 3 is positioned, the semiconductor chip is positioned accurately. In other words, the metallized layer 10 is extended up to the inner wall of the recess 9, which is closer to the drain bonding pad 6D and the metallized layer 10 is the same in size as the semiconductor chip 3. Consequently, the semiconductor chip 3 is to be put on the fused fusion bonding material 11 properly due to the surface tension of the fused bonding material 11, the semiconductor chip 3 moves due to the self-alignment action of the bonding material 11 by its surface tension, so that one side of the chip 3 comes in contact with the inner wall of the recess 9, which is closer to the drain bonding pad 6D even when the semiconductor chip 2 is not supplied properly in position with respect to the metallized layer 10.

(4) Consequently, the length of the drain wire 7D for connecting the drain electrode of the semiconductor chip 3 to the drain bonding pad 6D provided on the surface of the module substrate 2 is fixed, thereby the wire inductance is fixed. Consequently, both output and efficiency of each communication system of the mobile phone in which the semiconductor device in this first embodiment is built are fixed, thereby the mobile phone (radio communication device) in this embodiment can have stable characteristics.

(5) The mobile phone in which the high frequency power amplification unit 1 in this first embodiment is built can be used for two communication systems (GSM and CDS). Both input and output terminals of one of the two communication systems are independent of the other, so that the drain side parasitic inductance is reduced.

(6) According to the manufacturing method of the high frequency power amplification unit in this first embodiment, recesses 9 are formed in the main surface of the module substrate 2 (wiring substrate) and a metallized layer 10 is formed at the bottom of each recess 9 so as to be extended up to the inner wall of the recess 9, which is closer to the drain bonding pad 6D. The metallized layer 10 is the same as the semiconductor chip 3 in size. Then, the fusion bonding material 11 is put on the metallized layer 10 and a semiconductor chip 3 is supplied on the fusion bonding material 11. The semiconductor chip 3, when the fusion bonding material 11 is heated and fused temporarily, comes to be positioned and fixed at the bottom of the recess 9 due to the self-alignment action of the fused bonding material 11. Consequently, one side of the semiconductor chip 3 comes in contact with the inner wall of the recess 9, which is closer to the drain bonding pad 6D, when it is fixed there, so that the position of the drain of the semiconductor chip 3 is always fixed. As a result, the length of the drain wire 7D is made contact, thereby the variation of the wire inductance is reduced. This is why both efficiency and output of the mobile phone in which the high frequency power amplifier unit 1 in this first embodiment is built are stabilized.

Second Embodiment

Figure 16:
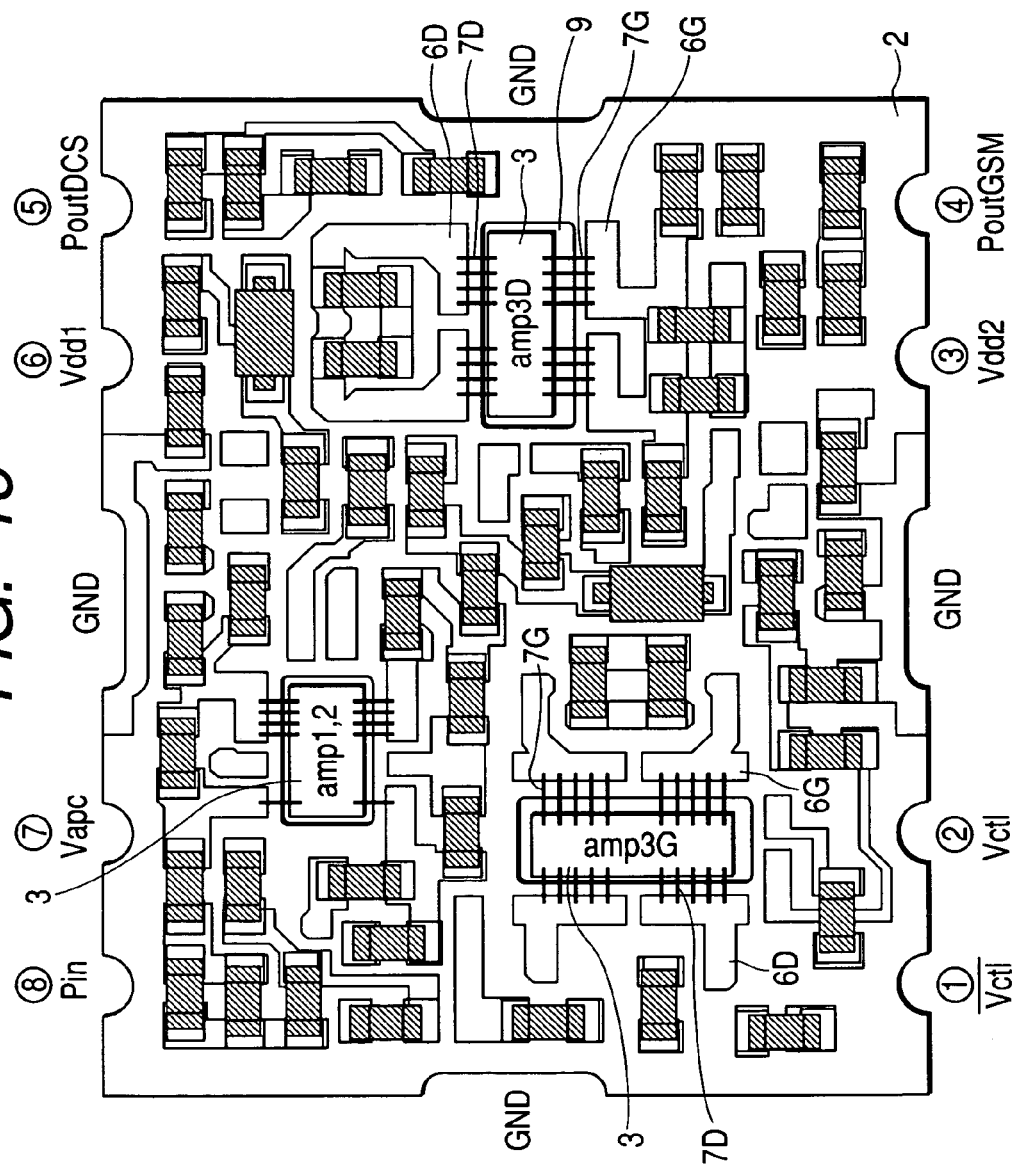
FIG. 16 is a top view of electronic parts laid out on the module substrate of a high frequency power amplification unit in another (second) embodiment of the present invention.
Figure 17:
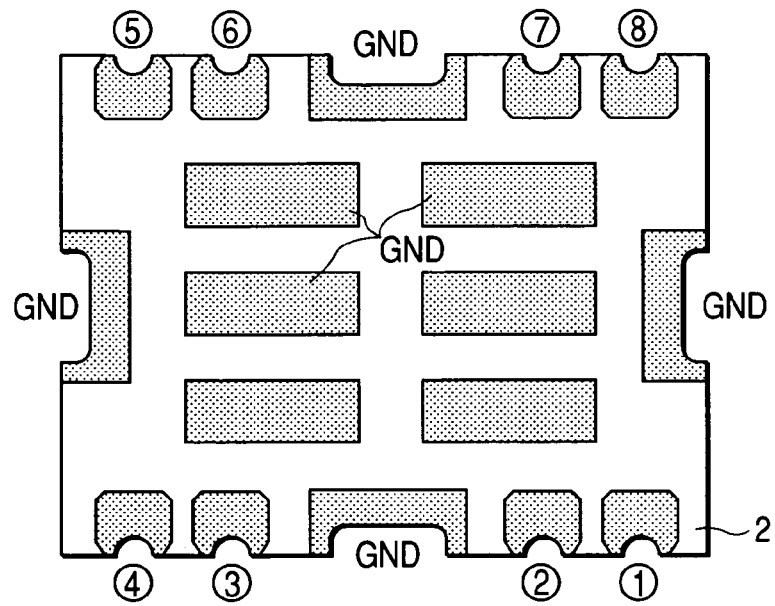
FIG. 17 is a bottom view of the module substrate of the high frequency power amplification unit in the second embodiment of the present invention.
Figure 18:
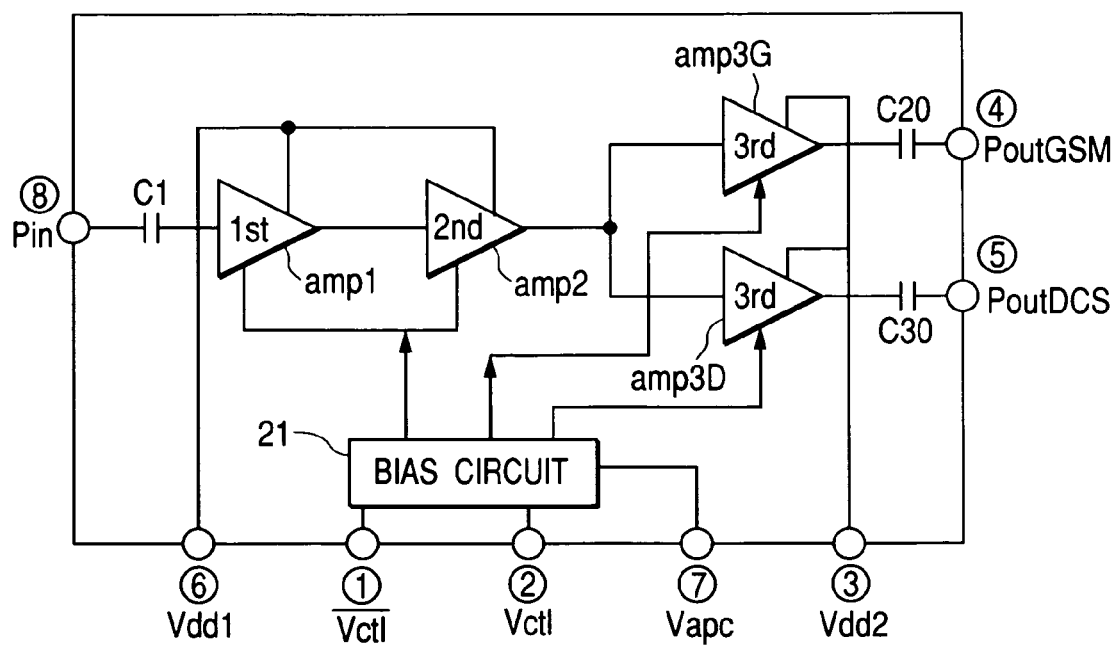
FIG. 18 is a circuit diagram of the high frequency power amplification unit in the second embodiment of the present invention.

FIGS. 16 through 18 show illustrations related to a high frequency power amplification unit in another (the second) embodiment of the present invention. FIG. 16 is a top view of a layout of electronic parts mounted on the module substrate of the high frequency power amplification unit.

FIG. 17 is a bottom view of the module substrate and FIG. 18 is a circuit diagram of the high frequency power amplification unit.

Just like the first embodiment, the high frequency power amplification unit 1 in this second embodiment includes multistage amplifier units for both GSM and DCS communication systems. However, the high frequency power amplification unit 1 in this second embodiment, as shown in FIGS. 16 through 18, has an input terminal (Pin) common to both GSM and DCS communication systems, so that the unit 1 is configured as a 2-input terminal and 2-output terminal unit.

As shown in FIG. 16, a /Vct1 terminal (1), a Vct1 terminal (2), a ground terminal (GND), a Vdd2 terminal (3), and a Pout-GSM terminal (4) are disposed in order from left to right on this side while a Pout-DCS terminal (5), a Vdd1 terminal (6), a ground terminal (GND), a Vapc terminal (7), and an input terminal Pin (8) that is common to both GSM and DCS are disposed in order from right to left on the other side.

In the multistage amplifier configuration as described above, the Pin (8) is connected to the amp1 through a capacitor C1. The amp1 is connected to the amp2 serially to configure the first amplifier (amplification stage) and the next stage amplifier (amplification stage) of both GSM and DCS. The amp2 is connected to the amp3G of the final stage amplifier (amplification stage) of GMS and the amp3D of the final stage amplifier (amplification stage) of DCS serially. The amp3G is connected to the Pout-GSM terminal (4) through a link capacitor C20 and the amp3D is connected to the Pout-DCS terminal (5) through a link capacitor C30.

Both amp1 and amp2 are formed monolithically in a single semiconductor chip 3 as shown in FIG. 16. The amp3D is formed in a single semiconductor chip as shown in FIG. 16. The edge of the semiconductor chip 3, which is closer to the drain bonding pad 6D, is in contact with the inner wall of the recess 9, which is closer to the drain bonding pad 6D so that the drain wire 7D is reduced in length. This is the same as that in the first embodiment.

Furthermore, as shown in FIG. 16, the amp3G is formed in a single semiconductor chip 3 and the edge of the semiconductor chip 3, which is closer to the drain bonding pad 6D, comes in contact with the inner wall of the recess 9, which is closer to the drain bonding pad 6D so that the drain wire 7D is reduced in length. This is also the same as that in the first embodiment. And, just like the first embodiment, description for wirings and chip parts mounted on the main surface of the module substrate 2 with reference to their numerals/symbols will be omitted here.

Each of the /Vct1 terminal (1), the Vct1 terminal (2), and the Vapc terminal (7) is connected to the bias circuit 21. The bias circuit 21 applies a bias potential to the amp1, amp2, amp3G, and amp3D respectively. The Vdd1 (6) applies a supply potential to the amp1 and amp2 transistors and the Vdd2 applies a supply potential to the final stage transistors of both GSM and DCS.

Also in this second embodiment, it is possible to reduce the drain parasitic inductance of the final stage transistors of both DCS and GSM. In addition, it is possible to suppress the variation of the parasitic inductance, since whether or not each semiconductor chip 3 is positioned and fixed accurately is decided by one side of the inner wall of the recess 9.

In the first and second embodiments, each amplification stage is configured by a semiconductor amplification element (transistor) that is a MOS (Metal Oxide Semiconductor) FET. It may also be configured by another type transistor. For example, a silicon bipolar transistor, a GaAs-MES (Metal-Semiconductor) FET, HBT (Hetero Junction Bipolar Transistor), HEMT (High Electron Mobility Transistor), Si-GeFET, or the like. Especially, a high performance transistor can be used effectively in the final amplification stage, which is an output stage.

Third Embodiment

Figure 19:
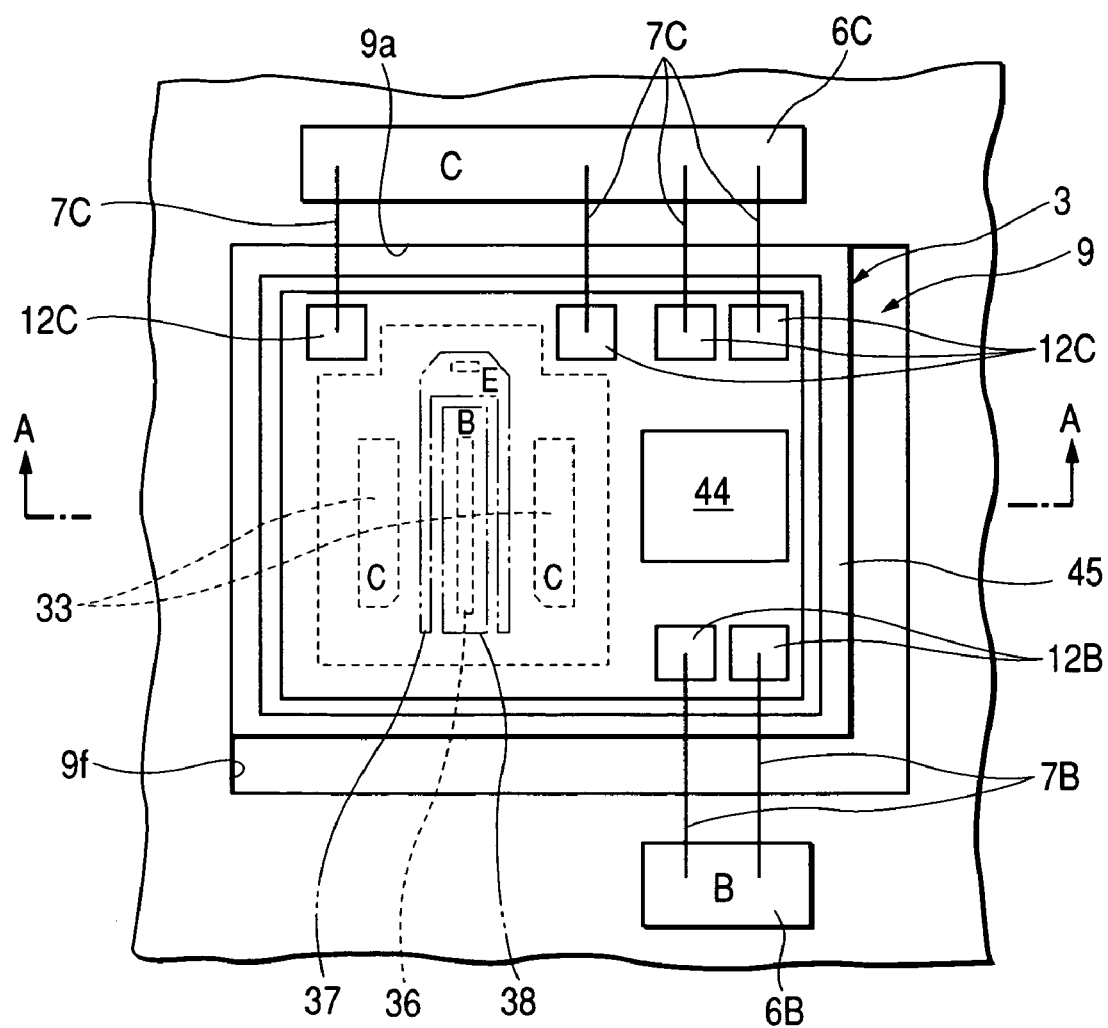
FIG. 19 is an explanatory top view of a hetero bipolar transistor chip mounted in a high frequency power amplification unit in still another (third) embodiment of the present invention.

FIG. 19 is a block diagram of a high frequency power amplification unit in the third embodiment of the present invention. In this third embodiment, each semiconductor chip 3 is positioned and fixed in a square recess 9 with respect to two adjacent sides of the recess 9 formed in the main surface of the module substrate 2. Those two sides are used as references for the positioning and fixing. The corresponding two sides (left and upper sides in FIG. 19) of the semiconductor chip 3 come in contact with those two sides (left and upper sides in FIG. 19) of the recess 9. In this example, a hetero bipolar transistor (HBT) is used as the transistor, that is, an amplifier.

Figure 21:
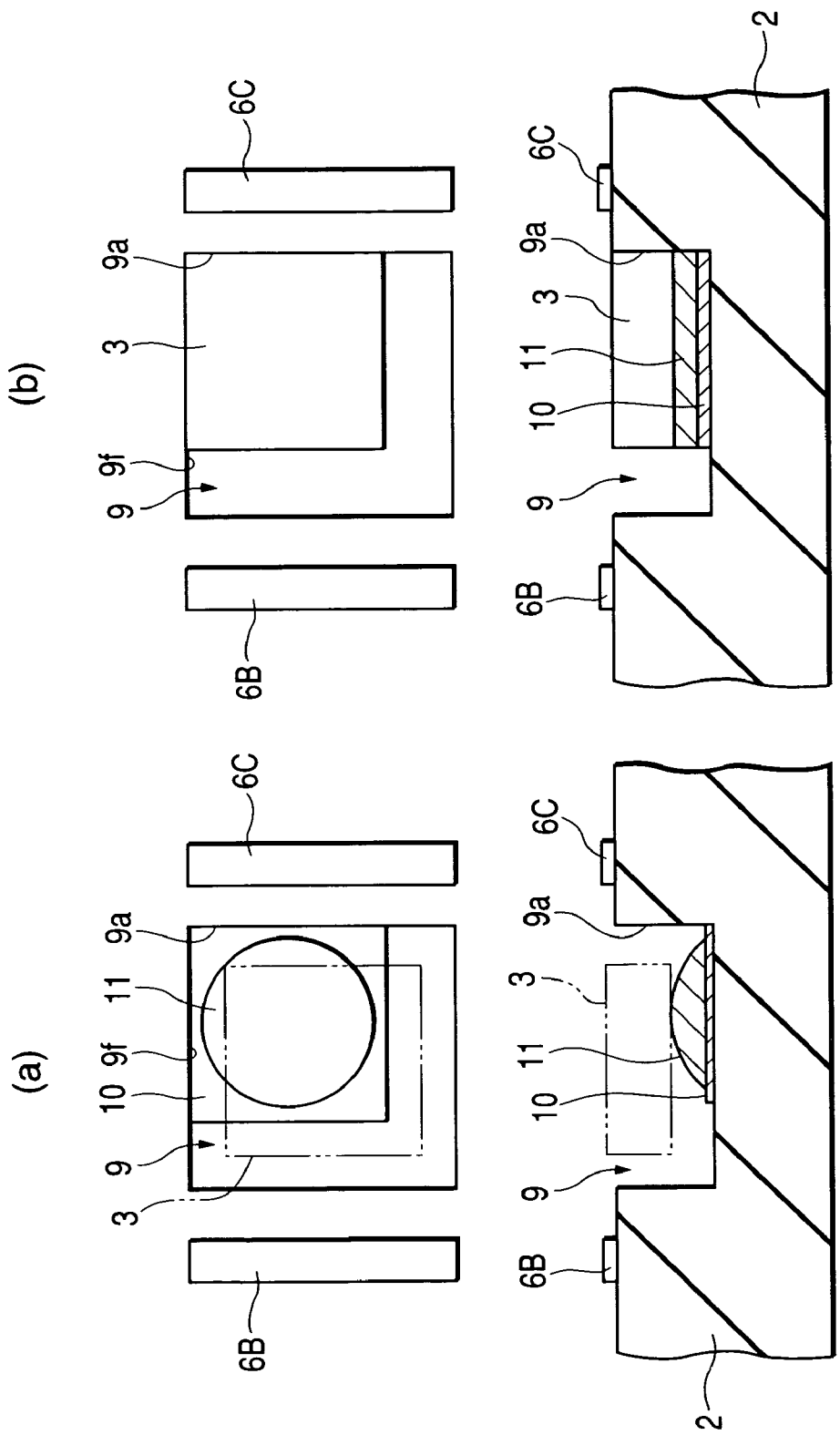
FIGS. 21A and 21B are explanatory top and cross sectional views of the hetero bipolar transistor chip before and after it is mounted in the high frequency power amplification unit.

In this third embodiment, as shown in FIGS. 21A and 21B, each semiconductor chip 3 is fixed at the bottom of a recess 9. FIGS. 21A and 21B are explanatory views of how the semiconductor chip 3 that includes the final stage transistor will become before and after it is fixed in the recess 9. FIG. 21A shows the semiconductor chip 3 being supplied on the fusion bonding material (for example, silver paste) disposed on the metallized layer 10. The upper illustration is a top view and the lower illustration is a cross sectional view. FIG. 21B shows the semiconductor chip 3 that is already fixed. The upper illustration is a top view and the lower illustration is a cross sectional view.

In the recess 9 in which a semiconductor chip 3 that includes the transistor as the final stage amplifier, as shown in FIG. 21A, the metallized layer 10 is extended up to one side 9a of the inner wall, which is closer to the collector bonding pad 6C of the recess 9, as well as up to another side 9f adjacent to the inner wall.

Consequently, as shown in FIG. 21A, after the predetermined amount of fusion bonding material 11 is supplied on the metallized layer 10 formed at the bottom of the recess 9 by a dispenser, the semiconductor chip 3 is supplied on the fusion bonding material 11 by the chip bonding device (not shown). Then, the fusion bonding material 11 is heated and fused (reflowing), and using the self-alignment action by the surface tension of the fused bonding material 11, the semiconductor chip 3 is fixed to the metallized layer 10.

At this time, the bonding material 11 should desirably be supplied on the metallized layer 10, since the material 11 is heated and fused. This is to make the bonding material 11 wet and spread all over the metallized layer 10 that is the same in size as the semiconductor chip 3 and fix the bottom surface of the semiconductor chip 3 entirely on the metallized layer 10 with the bonding material 11 therebetween without making the bonding material 11 protruding from the metallized layer 10.

On the other hand, the semiconductor chip 3 is just required to be placed entirely on the bonding material 11; it is not required to be positioned so accurately. In other words, the chip bonding device is not required to be so accurate to position the semiconductor chip 3. The chip supply thus becomes easier.

When the fusion bonding material 11 reflows, the whole bottom surface of the semiconductor chip 3 of which center is deviated from the center of the metallized layer 10 gets wet with the bonding material 11 and the semiconductor chip 3 comes to float and move on the bonding material 11 due to the surface tension of the bonding material 11 so that the center of the semiconductor chip 3 is aligned to the center of the metallized layer 10. During this movement, one side of the semiconductor chip 3, which is closer to the collector bonding pad 6C, comes in contact with one side 9a of the inner wall of the recess 9 and another side of the semiconductor chip 3 comes in contact with another side 9f. The semiconductor chip 3 is thus positioned and fixed accurately in the recess 9 with respect to one side 9a and another side 9f of the inner wall (see FIG. 21B).

As a result, as shown in FIG. 19, the distance between the collector wire bonding pad 12C of the final stage transistor and the collector bonding pad 6C is shortened and fixed, thereby the length of the collector wire 7C for connecting them to each other is shortened and fixed. This is why the collector wire parasitic inductance is made uniform, the efficiency is stabilized, and the output is improved.

Hereunder, a description will be made briefly for the hetero bipolar transistor with reference to FIGS. 19 and 20. FIG. 19 is an explanatory top view of an HBT chip disposed in a high frequency power amplifier device and FIG. 20 is an explanatory cross sectional view of the disposed HBT chip.

Figure 20:
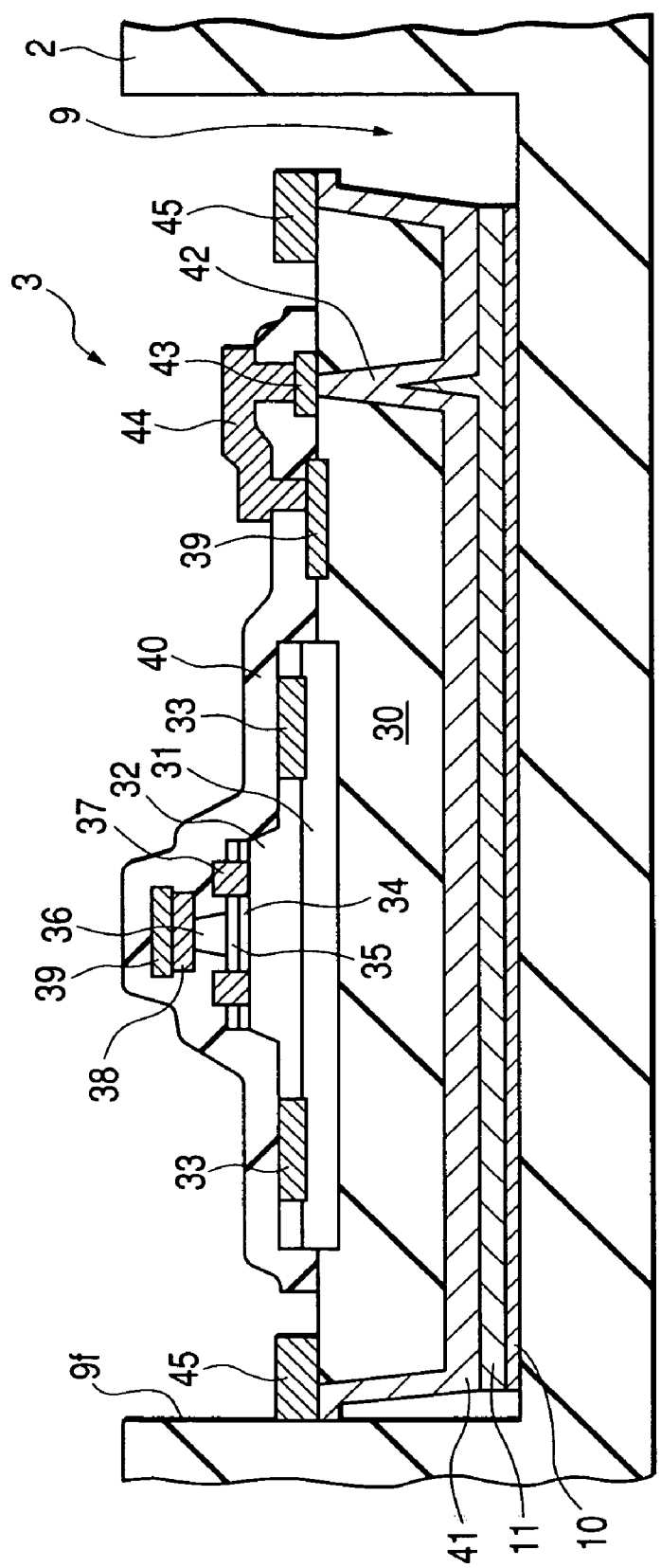
FIG. 20 is an explanatory cross sectional view of how the hetero bipolar transistor chip is mounted in the high frequency power amplification unit.

As shown in FIGS. 19 and 20, a semiconductor chip 3 in which an HBT is formed is structured so that an $n^+$ type GaAs sub-collector layer 31 is formed selectively on the main surface of the half-insulating GaAs substrate 30 and an n type GaAs collector layer 32 is formed on this sub-collector layer 31. The periphery of the collector layer 32 is etched up to a middle depth and the center thereof is protruded as a mesa part. In a region in which a thin collector layer is formed apart from the mesa part, the collector layer 32 is etched and removed partially, so that a collector electrode 33 is formed in the etched and removed region.

On the mesa part are formed a $p^+$ type GaAs base layer 34, an n type InGaP emitter layer 35, an $n^+$ type GaAs cap layer 36 in order so that one is placed upon another. The base layer 34 and the emitter layer 35 that are formed as one upon another are approximately the same in size while the cap layer 36 is formed as a long and narrow rectangle in the center of the mesa part.

In the mesa region formed apart from the cap layer 36, a contact hole is formed by removing both emitter layer 35 and base layer 34 selectively by etching and a base electrode 37 is provided in this contact hole.

An emitter electrode 38 is formed on the top face of the cap layer 36. And, an emitter wiring layer 39 is formed on the emitter electrode 38. Part of this emitter wiring layer 39 is extended to the surface of the half-insulating GaAs substrate 30 formed apart from the sub-collector layer 31 and the collector layer 32.

Each part element on the main surface of the half-insulating GaAs substrate 30 is covered and protected by an insulating film 40. This insulating film 40, although it is shown as an single layer, actually comprises a plurality of layers, each layer having a pattern different from others.

Because the HBT in this third embodiment is a PHS, an electrode layer 41 is formed all over the rear side of the half-insulating GaAs substrate. A second groove (via hole) 42 is formed from the main surface to the back side of the half-insulating GaAs substrate 30 so as to connect the electrode layer 41 to the emitter layer 39 formed on the half-insulating GaAs substrate 30. The end of the via hole 42 on the main surface of the half-insulating GaAs substrate 30 is closed by an etching stopper layer 43 formed of a conductive material. This etching stopper layer 43 is formed on the main surface of the half-insulating GaAs substrate 30 before the via hole is formed. The etching stopper layer 43 and the emitter layer 39 are connected to each other through a wiring layer 44 extended on the insulating film 40.

The electrode layer 41 is structured to cover the periphery of the semiconductor chip 3, as well. The tip of the layer 41 is on a metallic layer 45 (FIG. 20) provided on the main surface of the half-insulating GaAs substrate 30. While the semiconductor chip 3 is still part of a wafer, the metallic layer 45 to be used as an etching stopper layer is formed in advance on a scribe region (also referred to as a dicing region) formed on the main surface of the semiconductor wafer, then the scribe region on the rear side of the wafer is etched up to the metallic layer 45 when it is cut into semiconductor chips. And finally, the metallic layer 45 and the electrode layer 41 formed on the metallic layer 45 are cut along the scribe region to cut the wafer into semiconductor chips.

As shown in FIG. 19, the collector wire bonding pad 12C and the collector bonding pad 6C are connected electrically to each other through a collector wire 7C. The base wire bonding pad 12B and the base bonding pad 6B are connected electrically to each other through the base wire 7B.

When one side of the semiconductor chip 3, which is closer to the collector bonding pad 6C, comes in contact with one side (9a) of the inner wall of the recess 9, which is closer to the collector bonding pad 6C, another side of the chip 3 comes in contact with another side of the inner wall. Consequently, each collector wire bonding pad 12C is positioned fixedly, thereby the collector wire parasitic inductance is made constant. This makes both efficiency and output of the multistage amplification unit stable.

Consequently, the collector wire can be set at a predetermined length between the recess 9 and the collector bonding pad 6C, thereby the same effect as that of the first embodiment is obtained. Furthermore, because one side of the semiconductor chip 3 comes in contact with one side 9a of the inner wall of the recess 9, the collector bonding pad 6C can be disposed in a region formed apart from a region in which the edge of the recess 9 snags. The collector bonding pad 6C is formed flat, thereby the wire bonding property is improved.

Fourth Embodiment

Figure 22:
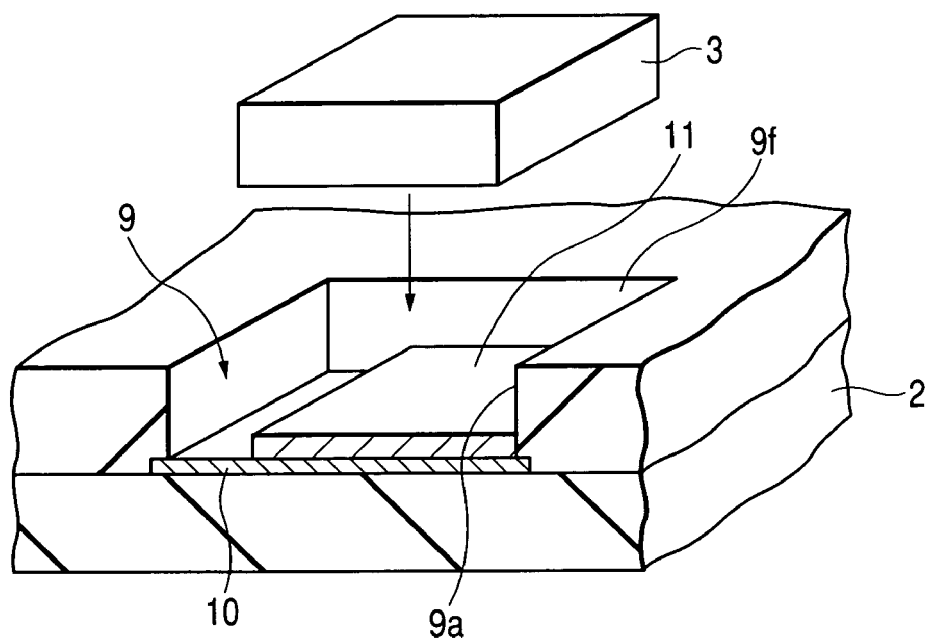
FIG. 22 is a perspective view of how a semiconductor chip is mounted in still another (fourth) embodiment of the present invention.
Figure 23:
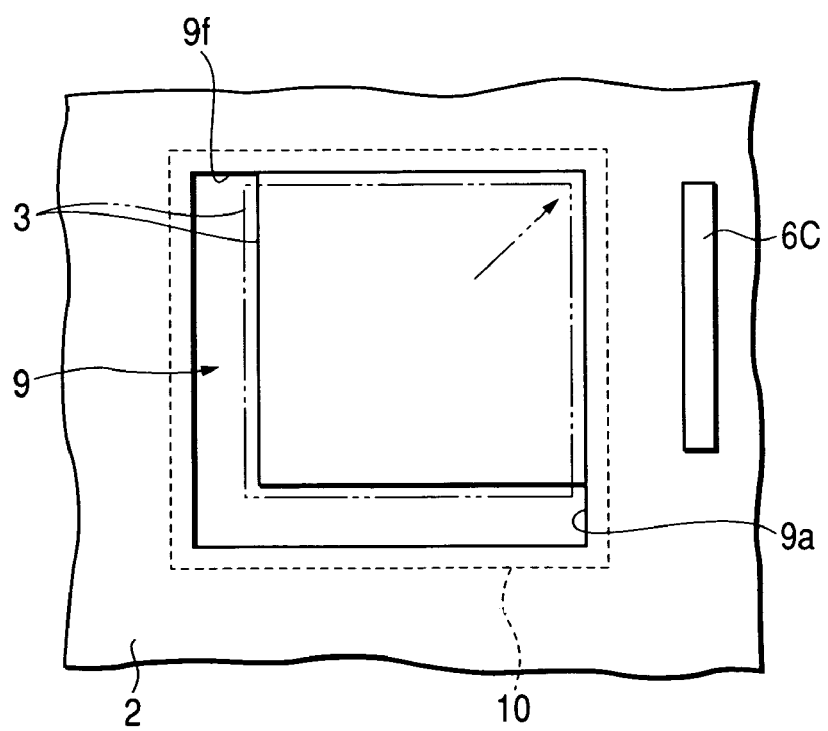
FIG. 23 is a top view of part of the module substrate on which the semiconductor chip is mounted.

FIG. 22 is a perspective view of how a semiconductor chip 3 is mounted on a module substrate in still another embodiment (fourth embodiment) of the present invention and FIG. 23 is a top view of part of the module substrate on which the semiconductor chip is mounted.

This fourth embodiment is a variation of the third embodiment described above. In this fourth embodiment, a metallized layer 10 is formed all over the bottom of each recess 9 and a fusion bonding material 11 is placed on part of the metallized layer 10. The bonding material 11 is the same in size as the semiconductor chip 3. And, as shown in FIG. 22, a semiconductor chip 3 is positioned and fixed at the bottom of each recess 9 due to the self-alignment action of the fused bonding material 11 by its reflow. As shown in FIG. 23, two adjacent sides of the square bonding material 11 are put in contact with two adjacent sides of the inner wall of the square recess 9. Consequently, even when the semiconductor chip 3 is placed inaccurately in the recess 9, the semiconductor chip 3 is moved to a corner of the recess 9 due to the self-alignment action of the reflowing bonding material 11 by its surface tension, thereby the two adjacent sides of the chip 3 come in contact with the two adjacent sides of the inner wall of the recess 9 so that the chip 3 is positioned and fixed there accurately just like the third embodiment.

In this fourth embodiment, the fixing position of the semiconductor chip 3 is decided by both position and shape of the supplied bonding material 11.

Fifth Embodiment

FIGS. 24A and 24B are explanatory top and cross sectional views of how a semiconductor chip 3 is mounted on a module substrate 2 in still another embodiment (fifth embodiment) of the present invention.

In this fifth embodiment, a metallized layer 10 is formed in the same shape as that of the semiconductor chip 3 on the flat top face of the module substrate 2, then a predetermined amount of fusion bonding material 11 is supplied on the metallized layer 10 and the semiconductor chip 3 is placed on the bonding material 11. After that, the bonding material reflows to position and fix the semiconductor chip 3 accurately on the metallized layer 10 due to the self-alignment action of the fused bonding material 11 by its surface tension.

In this fifth embodiment, the fixing position of the semiconductor chip 3 is decided by both position and shape of the metallized layer 10 disposed on the flat surface of the module substrate 2.

While the preferred form of the present invention has been described concretely with reference to some embodiments, it is to be understood that modifications will be apparent to those skilled in the art without departing from the spirit of the invention.

While a description has been made mainly for a mobile phone, which is a technical field of the background of the present invention, the invention may also apply to any of other electronic devices and semiconductor devices (composite integrated circuit devices) similarly. In other words, the high frequency power amplification unit of the present invention can be used as a power amplifier for various types of radio communication devices including such mobile phones as mobile communication terminals. In addition, the present invention can provide a radio communication device that realizes stable communications. In addition, the present invention can improve the manufacturing yields of high frequency power amplification modules and radio communication devices, thereby enabling the manufacturing costs of those devices to be reduced.

Typical effects of the present invention disclosed in this specification will be summarized as follows.

(1) In a semiconductor chip 3 in which a multistage amplifier unit is built, each semiconductor element to be disposed in an amplification stage is positioned and fixed accurately on a metallized layer formed in the same size as that of the element due to the self-alignment action of a fused bonding material by its surface tension.

(2) The metallized layer is formed at the bottom of each square recess so that it comes in contact with one side of the inner wall of the recess, thereby one side of the element can be put in contact with one side of the inner wall of the recess and the semiconductor element is positioned accurately. Consequently, both drain and collector wires are extended to cross a place where the element is positioned, thereby each wire is made constant in length and the variation of the wire inductance is reduced. Consequently, both efficiency and output power of the multistage amplification unit are improved.

(3) Because the semiconductor element can be fixed at the bottom of the recess while its one side comes in contact with one side of the inner wall of the recess as described in (2), both drain and collector bonding pads can be formed in a region apart from the sags to occur at the periphery of the recess. The bonding property is thus improved, thereby the reliability of the semiconductor chip 3 is improved. In addition, both drain and collector wires can be reduced in length, since one side of the semiconductor element comes in contact with one side of the inner wall of the recess. The wire parasitic inductance can thus be reduced.

(4) The output of the semiconductor device in which a multistage amplifier unit is built, as well as the output of the radio communication device in which the high frequency power amplification unit is built are improved.

INDUSTRIAL APPLICABILITY

As described above, the high frequency power amplification unit of the present invention can be used effectively as a power amplifier for various types of radio communication devices including such mobile phones as mobile communication terminals.

What is claimed is:

1. A method for manufacturing a semiconductor device comprising:
    a wiring substrate;
    a plurality of semiconductor chips, in each of which a transistor is built, each of said semiconductor chips being fixed over a metallized layer formed over a main surface of said wiring substrate with a fusion bonding material therebetween; and
    a conductive wire for electrically connecting an electrode for controlling said semiconductor chip and an electrode for outputting a signal to a bonding pad provided over said main surface of said wiring substrate,
    wherein each of said plurality of transistors is connected to another in order serially in a circuit manner so as to form a multistage amplifier unit of multiple configuration,
    wherein said method fixes said semiconductor chip one-sidedly so that at least in one of said plurality of transistors, a length of said wire for connecting said signal output electrode to said bonding pad becomes shorter than that of said wire for connecting said control electrode to said bonding pad.

2. The method according to claim 1,
    wherein said fusion bonding material is disposed over said metallized layer, said semiconductor chip is placed over said fusion bonding material, then said fusion bonding material is heated temporarily to fix said semiconductor chip.

3. The method according to claim 2,
    wherein a recess is formed in said main surface of said wiring substrate and said metallized layer is formed at the bottom of said recess.

4. The method according to claim 3,
    wherein said metallized layer is formed all over the bottom of said recess and said fusion bonding material is provided over part of said metallized layer.

5. The method according to claim 3,
    wherein a metallized layer is formed at part of the bottom of said recess and said fusion bonding material is put over this metallized layer.

6. The method according to claim 3,
    wherein said metallized layer is formed so that one side thereof reaches one side of the inner wall of said recess, then said fusion bonding material is formed over said metallized layer, and when said semiconductor chip is fixed by temporary heating and fusion of said fusion bonding material, one side of said semiconductor chip comes in contact with one side of the inner wall of said recess by the self-alignment action due to surface tension of said bonding material, thereby fixing said semiconductor chip.

7. The method according to claim 3,
wherein said metallized layer is formed so that two adjacent sides of said metallized layer reach two adjacent sides of the inner wall of said recess, then said fusion bonding material is formed over said metallized layer, and when said semiconductor chip is fixed by temporary heating and fusion of said fusion bonding material, said two adjacent sides of said semiconductor chip are put in contact with said two adjacent sides of said inner wall of said recess, thereby fixing said semiconductor chip.

8. A method for manufacturing a semiconductor device having a plurality of amplification stages of a multistage amplifier unit, comprising the steps of:
    a) preparing a wiring substrate;
    b) forming a metalized layer over a main surface of said wiring substrate;
    c) forming a gate bonding pad and a drain bonding pad over the main surface of said wiring substrate;
    d) supplying a fusion bonding material on said metalized layer;
    e) mounting a first semiconductor chip including a first field effect transistor on said fusion bonding material;
    f) heating to fuse said fusion bonding material;
    g) connecting said gate electrode and gate bonding pad by a gate wire;
    h) connecting said drain electrode and drain pad by a drain wire wherein in the step (d), said fusion bonding material is supplied in an area which is closer to said drain bonding pad compared with said gate bonding pad;
    said first field effect transistor comprises a final amplification stage of said plurality of amplification stages;
    said drain wire is shorter than said gate wire; and
    said first semiconductor chip is fixed closer to said drain bonding pad.

9. The method for manufacturing the semiconductor device according to claim 8 wherein after the step W, a fixing position of said first semiconductor chip is corrected and fixed by a self-alignment action of said fusion bonding material.

10. The method for manufacturing the semiconductor device according to claim 8, wherein a recess is formed in the main surface of said wiring substrate; and
    in the step (e), said first semiconductor chip is mounted in said recess.

11. The method for manufacturing the semiconductor device according to claim 8, wherein said metalized layer is extended to an inner wall of said recess; and
    said inner wall is closer to said drain bonding pad compared with said gate bonding pad.

12. The method for manufacturing the semiconductor device according to claim 10, wherein said first semiconductor chip is contacted with an inner wall of said recess; and
    said inner wall is closer to said drain bonding pad compared with said gate pad.

13. The method for manufacturing the semiconductor device according to claim 8, further comprising the step of:
    (e2) mounting a second semiconductor chip over the main surface of said wiring substrate,
    wherein a second field effect transistor is formed in said second semiconductor chip; and said second field effect transistor comprises one of said plurality of amplification stages of said multistage amplifier unit; and
    an output of said second field effect transistor is inputted into said first bipolar transistor.

14. The method for manufacturing the semiconductor device according to claim 8, wherein said gate electrode and drain electrode are formed over a main surface of said first semiconductor chip; and
    a source electrode is formed on a back surface of said first semiconductor chip.

15. The method for manufacturing the semiconductor device according to claim 8, wherein said semiconductor device is employed in a radio communication device.

16. A method for manufacturing a semiconductor device having a plurality of amplification stages of a multistage amplifier unit, comprising the steps of:
    a) preparing a wiring substrate;
    b) forming a metalized layer over a main surface of said wiring substrate;
    c) forming a base bonding pad and a collector bonding pad over the main surface of said wiring substrate;
    d) supplying a fusion bonding material on said metalized layer;
    e) mounting a first semiconductor chip including a first bipolar transistor on said fusion bonding material;
    f) heating to fuse said fusion bonding material;
    g) connecting said base electrode and base pad by a base wire;
    h) connecting said collector electrode and collector pad by a collector,
    wherein in the step (d), said fusion bonding material is supplied in an area which is closer to said collector bonding pad compared with said base bonding pad;
    said first bipolar transistor comprises a final amplification stage of said plurality of amplification stages;
    said collector wire is shorter than said base wire; and
    said first semiconductor chip is fixed closer to said collector bonding pad.

17. The method for manufacturing the semiconductor device according to claim 16, wherein after the step (f), a fixing position of said first semiconductor chip is corrected and fixed by a self-alignment action of said fusion bonding material.

18. The method for manufacturing the semiconductor device according to claim 16, wherein a recess is formed in the main surface of said wiring substrate; and
    in the step (e), said first semiconductor chip is mounted in said recess.

19. The method for manufacturing the semiconductor device according to claim 18, wherein said metalized layer is extended to an inner wall of said recess; and
    said inner wall is closer to said collector bonding pad compared with said base bonding pad.

20. The method for manufacturing the semiconductor device according to claim 18, wherein said first semiconductor chip is contacted with an inner wall of said recess; and
    said inner wall is closer to said collector bonding pad compared with said base bonding pad.

21. The method for manufacturing the semiconductor device according to claim 16, further comprising the step of:
    (e2) mounting a second semiconductor chip over the main surface of said wiring substrate,
    wherein a second bipolar transistor is formed in said second semiconductor chip; and said second bipolar transistor comprises one of said plurality of amplification stages of said multistage amplifier unit; and an output of said second bipolar transistor is inputted into said first bipolar transistor.

22. The method for manufacturing the semiconductor device according to claim 16, wherein said semiconductor device is employed in a radio communication device.

* * * * *